(12) United States Patent
Park et al.

(10) Patent No.: US 10,991,716 B2
(45) Date of Patent: Apr. 27, 2021

(54) SEMICONDUCTOR DEVICE HAVING A VERTICAL CHANNEL LAYER WITH AN IMPURITY REGION SURROUNDING A DIELECTRIC CORE

(71) Applicant: SK hynix Inc., Icheon-si (KR)

(72) Inventors: In Su Park, Icheon-si (KR); Do Yeon Kim, Yongin-si (KR); Ki Hong Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/360,447

(22) Filed: Mar. 21, 2019

(65) Prior Publication Data
US 2020/0075629 A1 Mar. 5, 2020

(30) Foreign Application Priority Data
Aug. 28, 2018 (KR) .................. 10-2018-0101572

(51) Int. Cl.
| | |
|---|---|
| *H01L 27/11582* | (2017.01) |
| *H01L 29/10* | (2006.01) |
| *H01L 23/528* | (2006.01) |
| *H01L 29/08* | (2006.01) |
| *H01L 29/36* | (2006.01) |
| *H01L 21/3105* | (2006.01) |
| *H01L 21/311* | (2006.01) |
| *H01L 21/02* | (2006.01) |

(52) U.S. Cl.
CPC ...... *H01L 27/11582* (2013.01); *H01L 23/528* (2013.01); *H01L 29/0847* (2013.01); *H01L 29/1037* (2013.01); *H01L 29/36* (2013.01); *H01L 21/0217* (2013.01); *H01L 21/02164* (2013.01); *H01L 21/31053* (2013.01); *H01L 21/31111* (2013.01)

(58) Field of Classification Search
CPC ............. H01L 27/11582; H01L 23/528; H01L 29/0847; H01L 29/1037; H01L 29/36; H01L 21/02164; H01L 21/0217; H01L 21/31053; H01L 21/31111
USPC ........................................................ 257/324
See application file for complete search history.

(56) References Cited

U.S. PATENT DOCUMENTS

| | | | |
|---|---|---|---|
| 9,576,971 B2 | 2/2017 | Zhang et al. | |
| 2013/0092994 A1* | 4/2013 | Shim ................. | H01L 27/11556 257/314 |
| 2016/0163729 A1* | 6/2016 | Zhang ................ | H01L 27/1157 257/321 |

FOREIGN PATENT DOCUMENTS

KR 1020150041537 A 4/2015

* cited by examiner

*Primary Examiner* — Lex H Malsawma
*Assistant Examiner* — Eric W Jones
(74) *Attorney, Agent, or Firm* — William Park & Associates Ltd.

(57) ABSTRACT

A semiconductor device includes a core insulating layer extending in a first direction, an etch stop layer disposed on the core insulating layer, a channel layer extending along a sidewall of the core insulating layer and a sidewall of the etch stop layer, conductive patterns each surrounding the channel layer and stacked to be spaced apart from each other in the first direction, and an impurity region formed in an upper end of the channel layer.

12 Claims, 17 Drawing Sheets

SEMICONDUCTOR DEVICE HAVING A VERTICAL CHANNEL LAYER WITH AN IMPURITY REGION SURROUNDING A DIELECTRIC CORE

CROSS-REFERENCE TO RELATED APPLICATION

The present application claims priority under 35 U.S.C. § 119(a) to Korean patent application number 10-2018-0101572, filed on Aug. 28, 2018, in the Korean Intellectual Property Office, the entire disclosure of which is incorporated herein by reference.

BACKGROUND

1. Technical Field

Various embodiments generally relate to a semiconductor device and a method of manufacturing the semiconductor device, and more particularly, to a three-dimensional semiconductor device and a method of manufacturing the three-dimensional semiconductor device.

2. Related Art

A semiconductor device may include memory cells capable of storing data. A three-dimensional semiconductor device in which memory cells are arranged in three dimensions has been proposed to improve integration density of the semiconductor device. Various technologies for securing the reproducibility of a process and the operational reliability of the three-dimensional semiconductor device are being developed.

SUMMARY

According to an embodiment, a semiconductor device may include a core insulating layer extending in a first direction, an etch stop layer disposed on the core insulating layer, a channel layer extending along a sidewall of the core insulating layer and a sidewall of the etch stop layer, conductive patterns each surrounding the channel layer and stacked to be spaced apart from each other in the first direction, and an impurity region formed in an upper end of the channel layer.

According to an embodiment, a method of manufacturing a semiconductor device may include forming a stack structure, forming a hole passing through the stack structure, forming a channel layer on a sidewall of the hole, filling a central region of the hole which is opened by the channel layer with a core insulating layer, injecting an impurity into the channel layer to form an impurity region, recessing a portion of the core insulating layer surrounded by the impurity region, and filling a recessed region of the core insulating layer with an etch stop layer.

DETAILED DESCRIPTION

The technical spirit of the present disclosure may include examples of embodiments to which various modifications and changes may be applied and which include various forms. Hereinafter, embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Various embodiments may be directed to a semiconductor device capable of securing the reproducibility of a process and the operational reliability of the semiconductor device, and a manufacturing method thereof.

Figure 1:
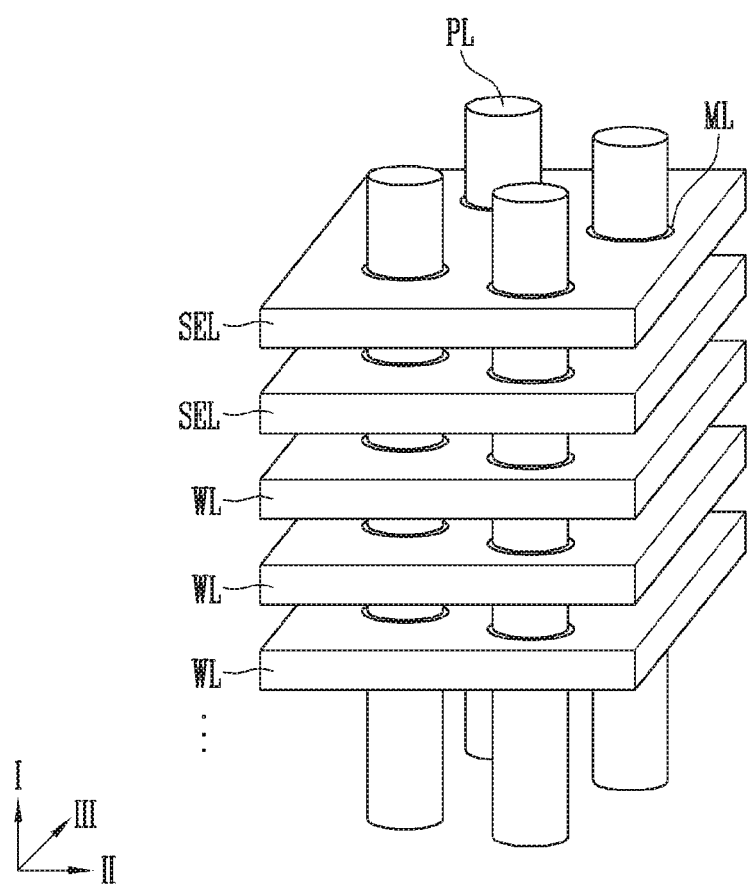
FIG. 1 is a perspective view schematically illustrating a semiconductor device according to an embodiment.

FIG. 1 is a perspective view schematically illustrating a semiconductor device according to an embodiment.

Referring to FIG. 1, a semiconductor device according to an embodiment may include conductive patterns WL and SEL stacked to be spaced apart from each other in a first direction I. Each of the conductive patterns WL and SEL may extend along a horizontal plane intersecting the first direction I. In other words, each of the conductive patterns WL and SEL may extend in second and third directions II and III which cross each other. The second and third directions II and III may cross the first direction I.

The conductive patterns WL and SEL may include the word lines WL and the select lines SEL. Each of the word lines WL may serve as a gate electrode of a memory cell and each of the select lines SEL may serve as a gate electrode of a select transistor. The select lines SEL may be disposed above the word lines WL. Although FIG. 1 illustrates two layers of the select lines SEL as an example, the embodiments may not be limited thereto. For example, at least one layer of a select line may be disposed above the word lines WL. For example, one layer of a select line, two layers of select lines as shown in FIG. 1, or three or more layers of select lines may be disposed above the word lines WL. Although not illustrated in FIG. 1, one or more layers of lower select lines may be disposed under the word lines WL to enclose channel pillars PL depending on the design of a semiconductor device.

Each of the conductive patterns WL and SEL may enclose the channel pillars PL. Multilayers ML including data storage layers may be disposed between each of the conductive patterns WL and SEL and the channel pillars PL, respectively. Although the multilayers ML may be formed at interfaces between each of the conductive patterns WL and SEL and the channel pillars PL as illustrated in FIG. 1, the embodiments may not be limited thereto. For example, the multilayer ML may extend along a sidewall of the channel pillar PL in the first direction I. Alternatively, the multilayer ML may extend from an interface between each of the conductive patterns WL and SEL and the channel pillar PL along an upper surface and a lower surface of each of the conductive patterns WL and SEL in the second direction II and the third direction III.

The conductive patterns WL and SEL may be penetrated by the plurality of channel pillars PL. The channel pillars PL may be arranged in a zigzag type in the second direction II and the third direction III to increase arrangement density of memory cells.

FIGS. 2A to 2D are cross-sectional diagrams illustrating a channel pillar of a semiconductor device according to embodiments.

Referring to FIGS. 2A to 2D, the channel pillar PL may be disposed in a hole H passing through a stack structure ST.

The stack structure ST may include interlayer insulating layers ILD and the conductive patterns WL and SEL alternately stacked with each other in the first direction I. The conductive patterns WL and SEL may include the word lines WL and the select lines SEL. As described with reference to FIG. 1, the conductive patterns WL and SEL may be stacked to be spaced apart from each other in the first direction I and may be insulated from each other by the interlayer insulating layers ILD.

According to an embodiment, the multilayer ML described above with reference to FIG. 1 may be formed on a sidewall of the hole H passing through the stack structure ST. The multilayer ML may include a tunnel insulating layer TI, a data storage layer DS, and a blocking insulating layer BI. The tunnel insulating layer TI may be adjacent to the channel pillar PL and surround the channel pillar PL. The data storage layer DS may surround the channel pillar PL with the tunnel insulating layer TI interposed therebetween. The blocking insulating layer BI may surround the channel pillar PL with the tunnel insulating layer TI and the data storage layer DS interposed therebetween. The data storage layer DL may include various materials, for example, a nitride layer capable of trapping charges. Alternatively, the data storage layer DL may include silicon, a phase-change material, a nanodot, etc. The blocking insulating layer BI may include an oxide layer capable of blocking charges. The tunnel insulating layer TI may include a silicon oxide layer in which charge tunneling is available.

The channel pillar PL may include a core insulating layer CO, an etch stop layer ES, and a channel layer CH. The channel pillar PL may further include a diffusion prevention layer BA as illustrated in FIGS. 2B and 2D.

Figure 2A:
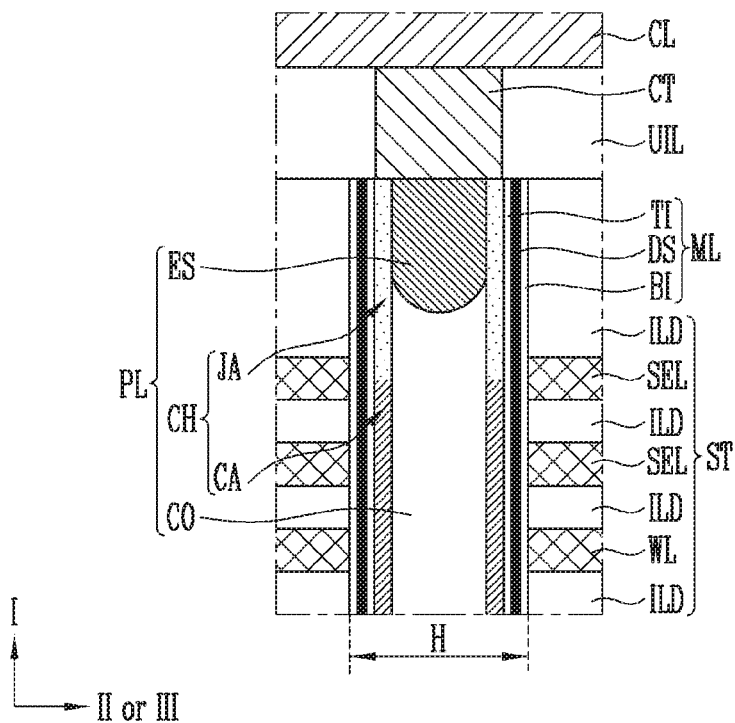
FIGS. 2A to 2D are cross-sectional diagrams illustrating a channel pillar of a semiconductor device according to embodiments.
Figure 2B:
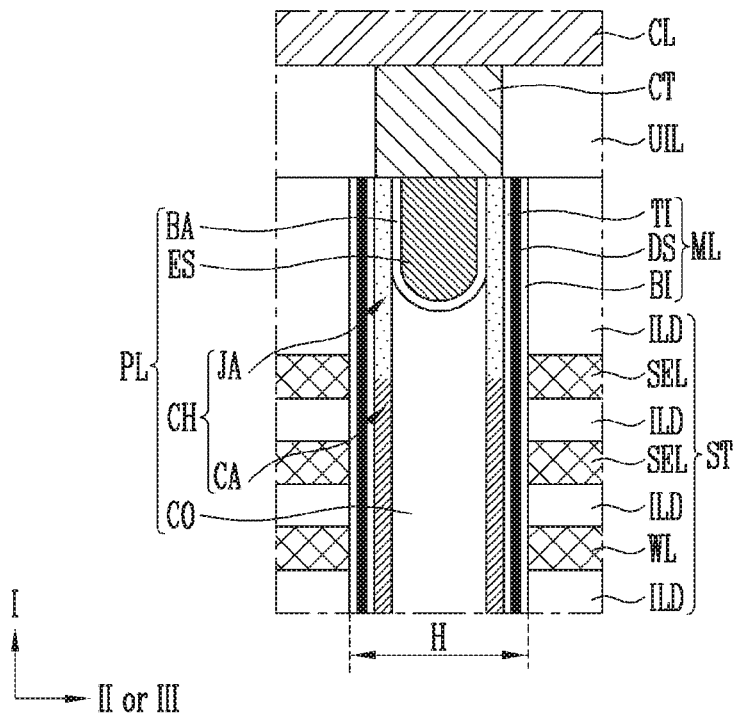
Figure 2C:
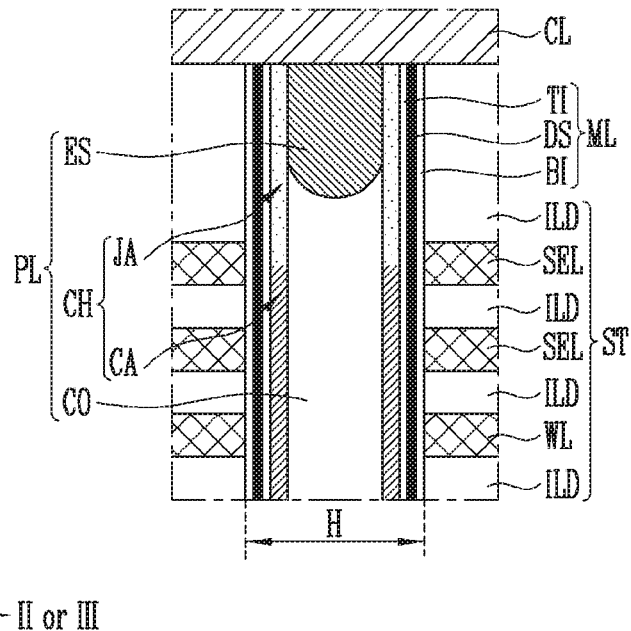
Figure 2D:
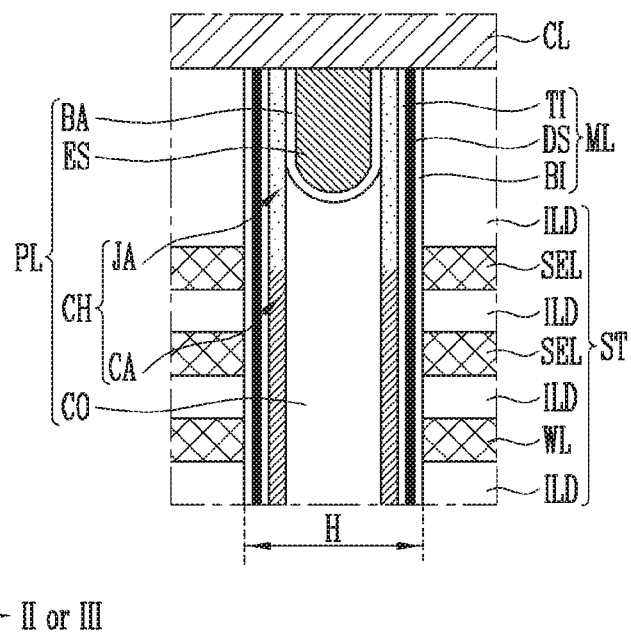

As illustrated in FIGS. 2A and 2B, the channel pillar PL may be electrically coupled to an upper conductive line CL extending in one direction (the second direction II or the third direction III) via a contact plug CT disposed on the channel pillar PL. The contact plug CT may pass through an upper insulating layer UIL disposed above the stack structure ST to directly contact the etch stop layer ES and the channel layer CH of the channel pillar PL. As illustrated in FIGS. 2C and 2D, the channel pillar PL may be directly coupled to the upper conductive line CL extending in one direction (the second direction II or the third direction III). For example, the upper conductive line CL may directly contact the etch stop layer ES and the channel layer CH of the channel pillar PL.

Referring to FIGS. 2A to 2D, the upper conductive line CL may extend in the second direction II or the third direction III. The upper conductive line CL may serve as a bit line coupled to a memory string of a three-dimensional semiconductor device or a common source line coupled to a memory string of a three-dimensional semiconductor device. Various embodiments of the structure of a memory string of a three-dimensional semiconductor device will be described below with reference to FIGS. 10A to 10D.

The core insulating layer CO of the channel pillar PL may extend in the first direction I and have a lower height than the stack structure ST. The etch stop layer ES of the channel pillar PL may be disposed on the core insulating layer CO. The core insulating layer CO and the etch stop layer ES may fill a central region of the hole H. In some embodiments, the core insulating layer CO and the etch stop layer ES may completely fill a central region of the hole H.

The channel layer CH of the channel pillar PL may extend along sidewalls of the core insulating layer CO and the etch stop layer ES in the first direction I. The channel layer CH may extend to enclose the sidewalls of the core insulating layer CO and the etch stop layer ES. Data stored in the data storage layer DS may be changed using a difference in voltage between the channel layer CH and the word line WL.

The channel layer CH may include an impurity region JA and a channel region CA. The impurity region JA may be formed injecting an impurity into an upper end of the channel layer CH adjacent to the upper conductive line CL and may serve as a junction. The impurity region JA may include an impurity having a higher concentration than the channel region CA. An impurity distributed in the impurity region JA may be an n-type dopant such as phosphorus (P). The channel region CA may be an undoped region or may include an n-type dopant having a lower concentration than the impurity region JA.

The impurity region JA may be distributed in a portion of a region of the channel layer CH which surrounds the etch stop layer ES. The impurity region JA may be distributed in a portion of a region of the channel layer CH to surround the etch stop layer ES and a portion of an upper end of the core insulating layer CO which is adjacent to the etch stop layer ES. The impurity region JA may overlap the uppermost select line adjacent to the upper conductive line CL among the select lines SEL. However, a distribution range of the impurity region JA may not be limited thereto according to the embodiments. A distribution range of the impurity region JA within the channel layer CH and a concentration of an impurity distributed in the impurity region JA may be variously changed depending on the design of a semiconductor device.

The impurity region JA may directly contact the contact plug CT shown in FIGS. 2A and 2B. Alternatively, the impurity region JA may directly contact the upper conductive line CL shown in FIGS. 2C and 2D.

The etch stop layer ES may have an etch resistance with respect to an etching material for etching an oxide layer. In addition, the etch stop layer ES may include a different material from the channel layer CH to suppress diffusion of an impurity or may include an undoped semiconductor layer distinguishable from the impurity region JA of the channel layer CH. For example, the etch stop layer ES may include at least one of an undoped semiconductor layer, a metal layer, a metal-containing layer, and a nitride layer. An undoped silicon layer may serve as an undoped semiconductor layer. A tungsten layer may serve as a metal layer. A titanium nitride layer or an aluminum oxide layer may serve as a metal-containing layer. A silicon nitride layer may serve as a nitride layer.

Each of the upper insulating layer UIL and the interlayer insulating layers ILD may include an oxide layer. The upper insulating layer UIL may be etched to form a contact hole in which the contact plug CT is disposed or a trench in which the upper conductive line CL is disposed. Since the etch stop layer ES has an etch resistance with respect to an etching material for an oxide layer, an etching process of the upper insulating layer UIL may be stopped when the etch stop layer ES is exposed.

Since the etch stop layer ES includes a material which may suppress diffusion of an impurity, a phenomenon in which an impurity within the impurity region JA diffuses into the etch stop layer ES may be improved. The channel pillar PL may further include the diffusion prevention layer BA. In an embodiment, the diffusion prevention layer BA may extend along an interface between the channel layer CH and the etch stop layer ES as illustrated in FIGS. 2B and 2D. The diffusion prevention layer BA may further improve the phenomenon in which an impurity within the impurity region JA diffuses into the etch stop layer ES. The diffusion prevention layer BA may further extend along the interface between the etch stop layer ES and the core insulating layer CO. The diffusion prevention layer BA may be formed when the etch stop layer ES includes an undoped silicon layer. The diffusion prevention layer BA may include an oxide layer.

As illustrated in FIGS. 2A and 2C, when the diffusion prevention layer BA is omitted, the etch stop layer ES may include a doped semiconductor layer including an impurity having a significantly lower concentration than the impurity region JA. According to an embodiment, a doped semiconductor layer for the etch stop layer ES may be a doped silicon layer. According to a manufacturing method of a semiconductor device, the etch stop layer ES may be formed after the impurity region JA is formed. The etch stop layer ES may be an undoped semiconductor layer when the etch stop layer ES is initially formed. An impurity included in the impurity region JA may be diffused into an undoped semiconductor layer during a manufacturing process of a semiconductor device. Thereby, after a manufacturing process of a semiconductor device is completed, the etch stop layer ES may include a doped semiconductor layer.

When the impurity region JA is formed, an impurity doping concentration may be controlled considering an impurity diffusion concentration to the etch stop layer ES. Thereby, after a manufacturing process of a semiconductor device is completed, an impurity concentration in the impurity region JA may be maintained at a target concentration. As described above, even when an impurity is diffused into the etch stop layer ES, an impurity concentration in the impurity region JA may be significantly higher than an impurity concentration in a doped semiconductor layer which serves as the etch stop layer ES. Accordingly, since diffusion of an impurity from the etch stop layer ES into the channel layer CH is difficult, a possibility in which an impurity concentration in the impurity region JA is changed out of target range due to reverse diffusion of an impurity from the etch stop layer ES into the channel layer CH may be low.

A depth of the etch stop layer ES to be formed may be changed according to a position of a memory string. According to embodiments, a phenomenon in which an impurity within the impurity region JA diffuses into the etch stop layer ES may be improved. In addition, a phenomenon in which an impurity present in the etch stop layer ES diffuses into the impurity region JA in reverse may be improved. Accordingly, even when a depth of the etch stop layer ES to be formed is changed, an impurity concentration of the impurity region JA and a distribution range of the impurity region JA may be uniformly controlled in memory strings included in a semiconductor device.

The impurity region JA may affect a threshold voltage of a select transistor coupled to the select line SEL overlapped with the impurity region JA. According to an embodiment, since an impurity concentration and a distribution range of the impurity region JA may be uniformly formed, distribution deterioration of threshold voltages of select transistors disposed at various positions may be decreased. Therefore, the operational reliability of a semiconductor device may be improved.

Figure 3:
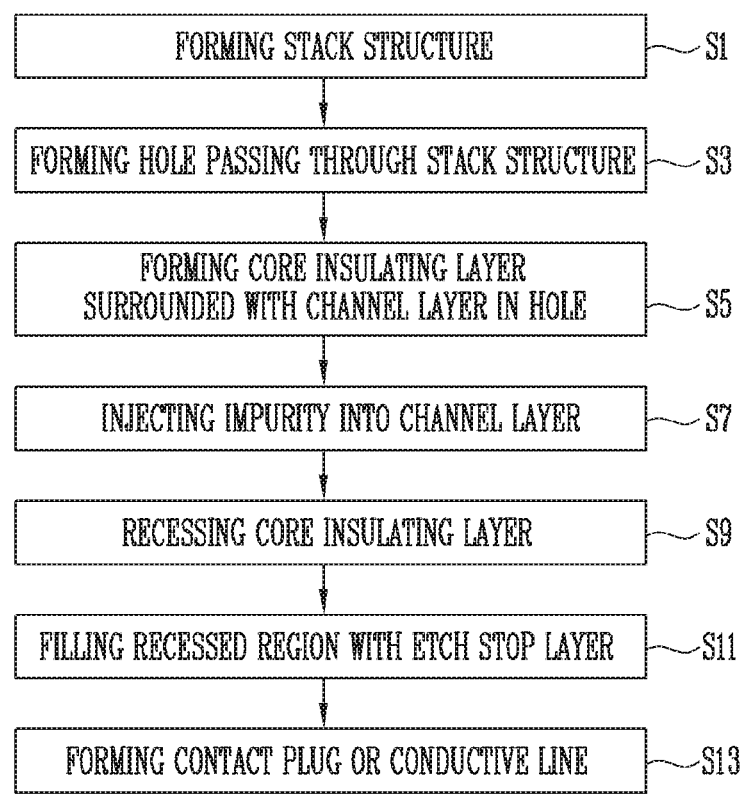
FIG. 3 is a flowchart schematically illustrating a manufacturing method of a semiconductor device according to an embodiment.

FIG. 3 is a flowchart schematically illustrating a manufacturing method of a semiconductor device according to an embodiment.

Referring to FIG. 3, after step S1 for forming a stack structure, step S3 for forming a hole passing through the stack structure may be performed. Thereafter, a core insulating layer surrounded with a channel layer may be formed in the hole during step S5. Subsequently, step S7 in which an impurity is injected into the channel layer may be performed. Step S7 may be performed in a state in which a central region of the hole is filled with the core insulating layer so that an inner wall of the channel layer facing the central region of the hole may be completely blocked by the core insulating layer from outside of the hole. In some embodiments, the core insulating layer may completely fill the central region of the hole.

According to an embodiment, after the impurity region is formed in the channel layer during step S7, step S9 for recessing a portion of the core insulating layer may be performed. Subsequently, step S11 for filling a recessed region of the core insulating layer with an etch stop layer and step 13 for forming a contact plug or a conductive line may be sequentially performed.

According to an embodiment, an impurity may be injected into the channel layer during step S7 before step S9 for recessing the core insulating layer. Accordingly, even when degrees of recess of the core insulating layer vary depending on positions during step S9, an impurity distribution region in the channel layer may be uniformly formed throughout the positions irrespective of the degrees of recess of the core insulating layer. When step S7 is performed after step S9, depths of portions of the channel layer which are exposed through recessed regions of the core insulating layer vary according to positions depending on degrees of recess of the core insulating layer. Since an injection depth of an impurity into the channel layer varies depending on a depth of an exposed portion of the channel layer, uniformly forming an impurity injection region in the channel layer may be difficult. According to an embodiment, since step S7 is performed before performing step S9, an impurity injection region may be uniformly formed in the channel layer.

Hereinafter, various manufacturing methods of a semiconductor device according to an embodiment will be described.

FIGS. 4A, 4B, 5A, 5B, 6A, 6B, 7A, and 7B are cross-sectional diagrams illustrating a manufacturing method of a semiconductor device according to an embodiment.

Figure 4A:
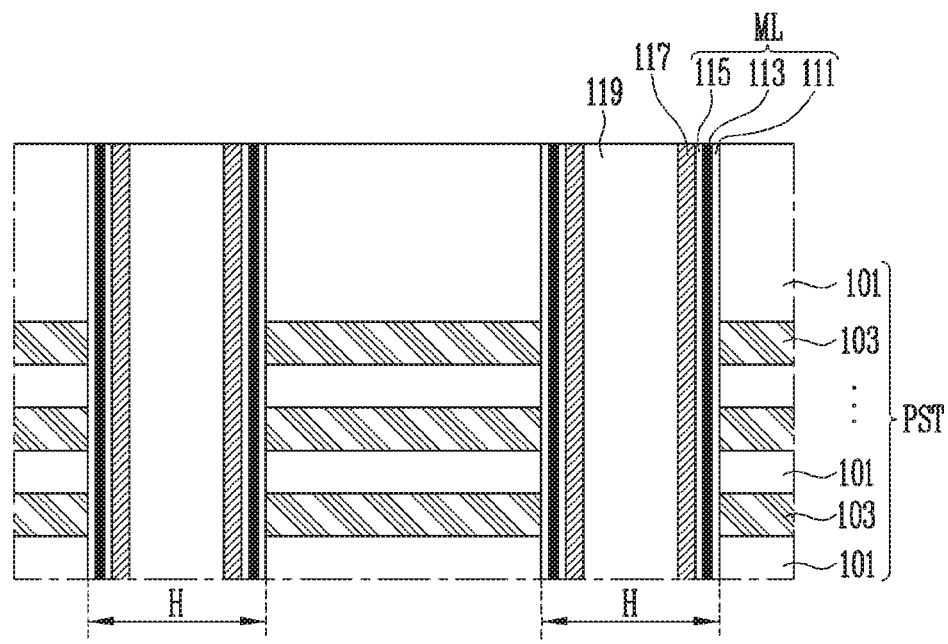
FIGS. 4A, 4B, 5A, 5B, 6A, 6B, 7A, and 7B are cross-sectional diagrams illustrating a manufacturing method of a semiconductor device according to an embodiment.
Figure 4B:
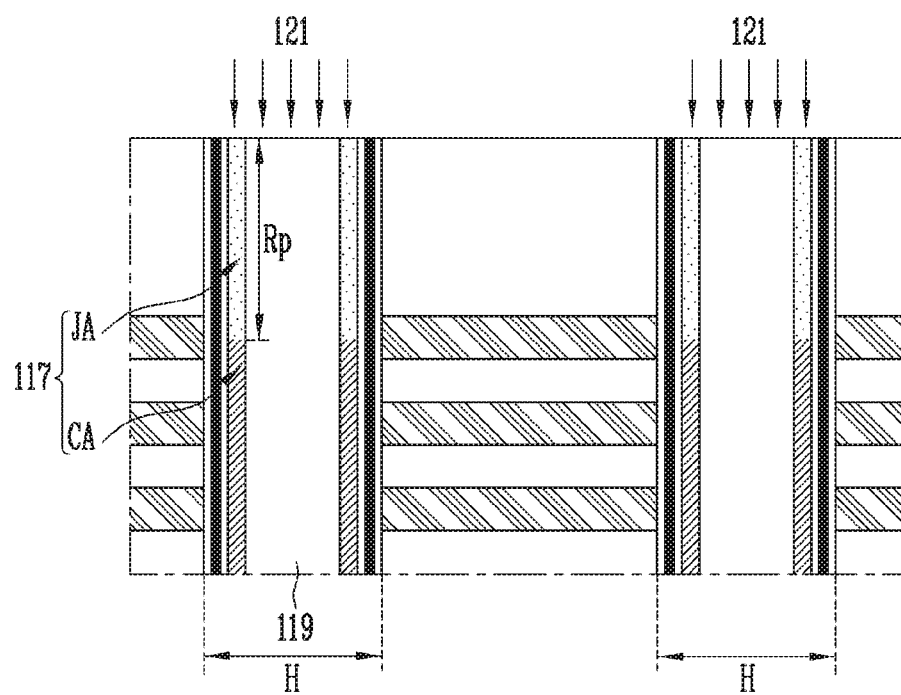

FIGS. 4A and 4B are cross-sectional diagrams illustrating steps S1 to S7 illustrated in FIG. 3.

Referring to FIG. 4A, a stack structure PST may be formed by alternately stacking each of first material layers 101 and each of second material layers 103. The first material layers 101 and the second material layers 103 may include different materials from each other.

According to first embodiments, each of the first material layers 101 may include a material which may not only insulate conductive patterns from each other but have a great etch resistance with respect to an etching material used during a subsequent etching process for selectively removing the second material layers 103. For example, each of the first material layers 101 may include an oxide layer such as a silicon oxide layer, and each of the second material layers 103 may include a nitride layer such as a silicon nitride layer. The first material layers 101 may remain as interlayer insulating layers after a manufacturing process of a semiconductor device is completed and the second material layers 103 may be replaced with conductive patterns during a subsequent process.

According to second embodiments, each of the first material layers 101 may include a material which may insulate conductive patterns from each other and each of the second material layers 103 may include various conductive materials for conductive patterns. For example, each of the first material layers 101 may include an oxide layer such as a silicon oxide layer and each of the second material layers 103 may include at least one of a silicon layer, a metal layer, and a metal silicide layer. In addition, each of the second material layers 103 may further include a barrier metal layer. The first material layers 101 may remain as insulating layers after a manufacturing process of a semiconductor device is completed, and the second material layers 103 may remain as conductive patterns after a manufacturing process of a semiconductor device is completed.

According to third embodiments, each of the second material layers 103 may include a conductive material for conductive patterns, and each of the first material layers 101 may include a material which may selectively remove the second material layers 103 and minimize a loss of the second material layers 103. For example, each of the first material layers 101 may include an undoped silicon layer and each of the second material layers 103 may include a doped silicon layer. The first material layers 101 may be replaced with interlayer insulating layers during a subsequent process, and the second material layers 103 may remain as conductive patterns after a manufacturing process of a semiconductor device is completed.

Subsequently, the holes H passing through the stack structure PST may be formed. The holes H may be formed by etching the first material layers 101 and the second material layers 103 by using a mask process including a photolithography process.

Thereafter, the multilayer ML may be formed along a sidewall of each of the holes H. Forming the multilayer ML may include forming a blocking insulating layer 111 on a surface of the sidewall of each of the holes H, forming a data storage layer 113 on the blocking insulating layer 111, and forming a tunnel insulating layer 115 on the data storage layer 113.

Subsequently, a channel layer 117 extending along the sidewall of each of the holes H may be formed on the multilayer ML. The channel layer 117 may include an undoped semiconductor layer or a doped semiconductor layer. For example, the channel layer 117 may include an undoped silicon layer or a doped silicon layer. The channel layer 117 may be conformally formed along an inner wall of each of the holes H and a central region of each of the holes H may be opened.

Thereafter, the central region of each of the holes H which is opened by the channel layer 117 may be completely filled with a core insulating layer 119. An upper surface of the core insulating layer 119 may be disposed on the same level as an upper surface of the channel layer 117.

Forming the core insulating layer 119 may include forming an insulating layer to completely fill a central region of each of the holes H and planarizing a surface of the insulating layer to expose an upper surface of the channel layer 117.

The core insulating layer 119 may include an oxide layer. A planarizing process may be performed by a Chemical Mechanical Polishing (CMP) process.

Referring to FIG. 4B, an impurity 121 may be injected into an upper end of the channel layer 117. The impurity 121 may be distributed within an impurity projected range Rp. The impurity 121 may include a dopant for forming a junction. For example, the impurity 121 may include an n-type dopant.

By injecting the impurity 121, the channel layer 117 may be divided into the impurity region JA into which the impurity 121 is injected and the channel region CA into which the impurity 121 is not injected. According to an embodiment, the impurity 121 may be injected when an inner wall of the channel layer 117 facing a central region of each of the holes H is completely blocked by the core insulating layer 119 and an upper surface of the channel layer 117 is exposed. Accordingly, the impurity region JA may be uniformly distributed into the impurity projected range Rp within the channel layer 117.

Figure 5A:
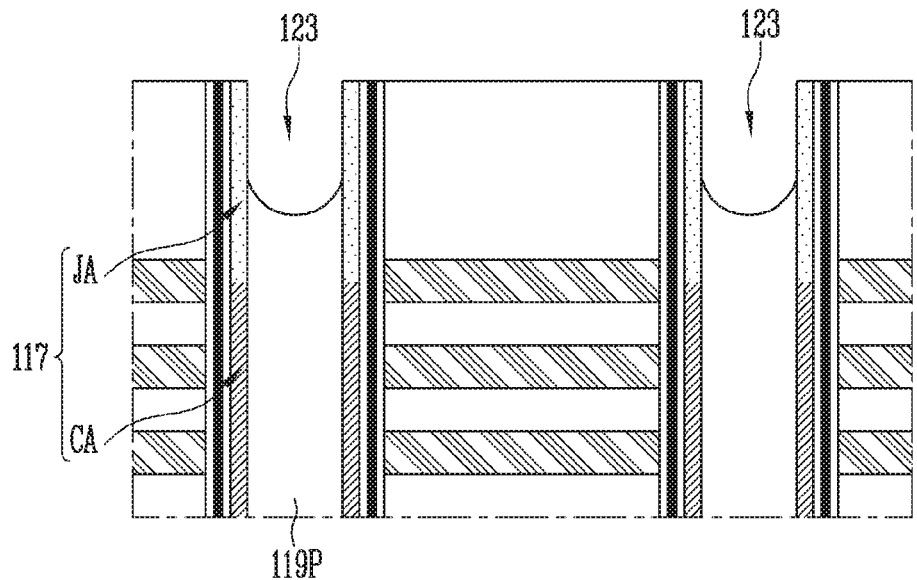
Figure 5B:
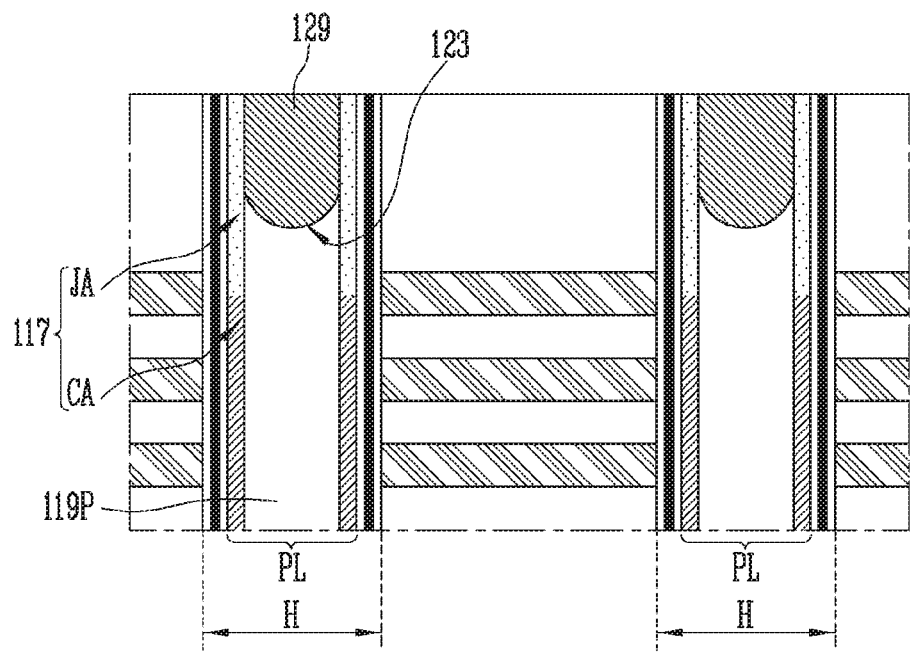

FIGS. 5A and 5B are cross-sectional diagrams illustrating steps S9 and S11 illustrated in FIG. 3.

Referring to FIG. 5A, a core insulating pattern 119P may be formed by recessing a portion of the core insulating layer 119 illustrated in FIG. 4B. Even when degrees of recess of the core insulating layer 119 are not uniform, the degrees of recess of the core insulating layer 119 may not affect a distribution range and an impurity concentration of the impurity region JA which is previously formed in the channel layer 117. The recessed portion of the core insulating layer 119 may be the portion surrounded with the impurity region JA.

The core insulating pattern 119P may have a lower height than the channel layer 117. A recessed region 123 surrounded with the impurity region JA may be defined on the core insulating pattern 119P. The impurity region JA may be exposed by the recessed region 123.

Referring to FIG. 5B, after filling the recessed region 123 with an etch stop layer 129, a surface of the etch stop layer 129 may be planarized to expose the channel layer 117. Thereby, the channel pillar PL may be formed within each of the holes H. The channel pillar PL may include the core insulating pattern 119P, the channel layer 117 surrounding the core insulating pattern 119P, and the etch stop layer 129 surrounded with the impurity region JA of the channel layer 117 and disposed on the core insulating pattern 119P.

As described with reference to FIGS. 2A to 2D, the etch stop layer 129 may include a material different from the channel layer 117 or include an undoped semiconductor layer. The etch stop layer 129 may have an etch resistance with respect to an etching material for an oxide layer. The etch stop layer 129 including an undoped semiconductor layer may include an impurity diffused from the impurity region JA by a heat generated during a manufacturing process. Therefore, after a manufacturing process of a semiconductor device is completed, the etch stop layer 129 may include a doped semiconductor layer. Since an impurity concentration in a doped semiconductor layer which constitutes the etch stop layer 129 is remarkably lower than an impurity concentration in the impurity region JA, reverse diffusion from the etch stop layer 129 to the impurity region JA may scarcely occur. Accordingly, an impurity concentration diffused into the etch stop layer 129 may be anticipated to control an impurity concentration in the impurity region JA within a target range after a manufacturing process of a semiconductor device is completed.

Figure 6A:
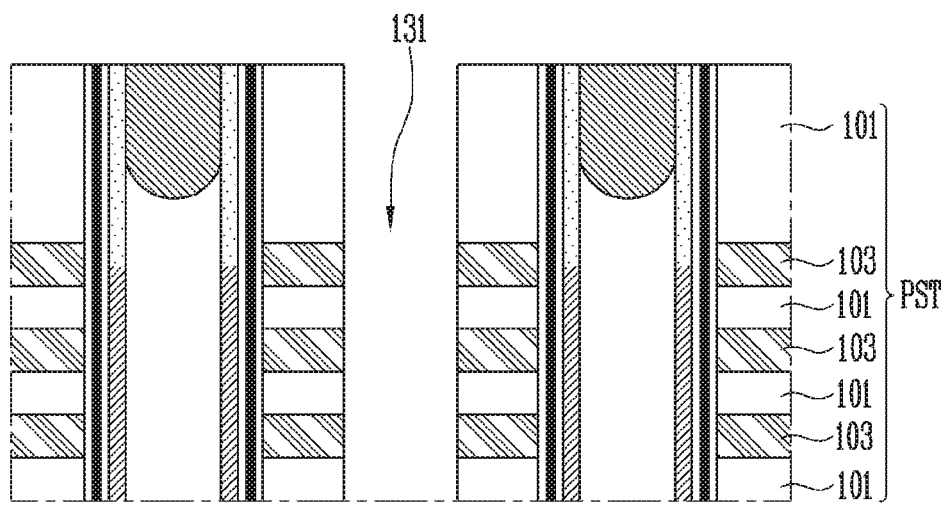
Figure 6B:
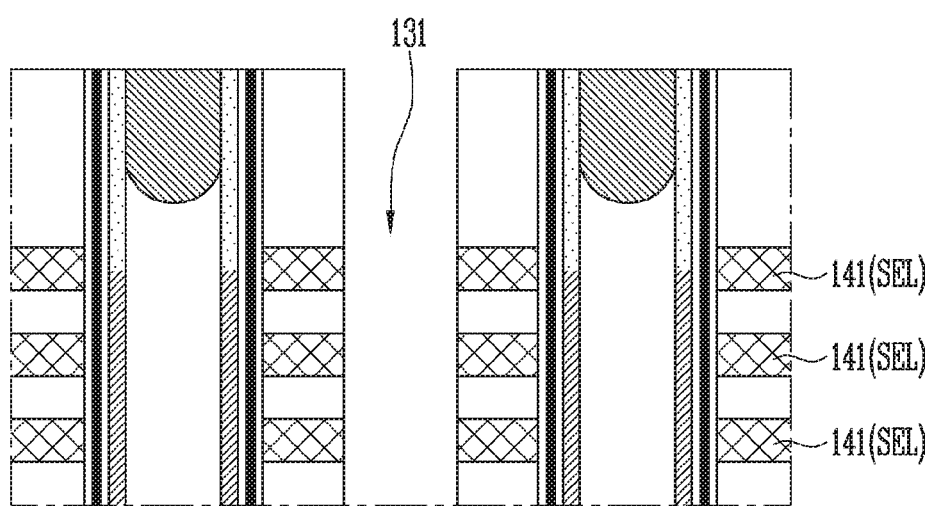

FIGS. 6A and 6B are cross-sectional diagrams illustrating processes which may be added before step S13 illustrated in FIG. 3. FIGS. 6A and 6B illustrate the first embodiments described with reference to FIG. 4A as an example.

Referring to FIG. 6A, a slit 131 passing through the stack structure PST may be formed. The slit 131 may expose a sidewall of each of the first material layers 101 and the second material layers 103.

Referring to FIG. 6B, after selectively etching the second material layers 103 shown in FIG. 6A through the slit 131, regions from which the second material layers 103 are removed may be filled with conductive patterns 141 serving as the word line WL and the select line SEL.

Although FIGS. 6A and 6B illustrate an example in which the second material layers 103 are replaced with the conductive patterns 141, the embodiments may not be limited thereto.

For example, according to the second and third embodiments described with reference to FIG. 4A, the second material layers may remain as the conductive patterns 141. According to the third embodiments, a process for replacing the first material layers with the insulating layers may be further performed.

Figure 7A:
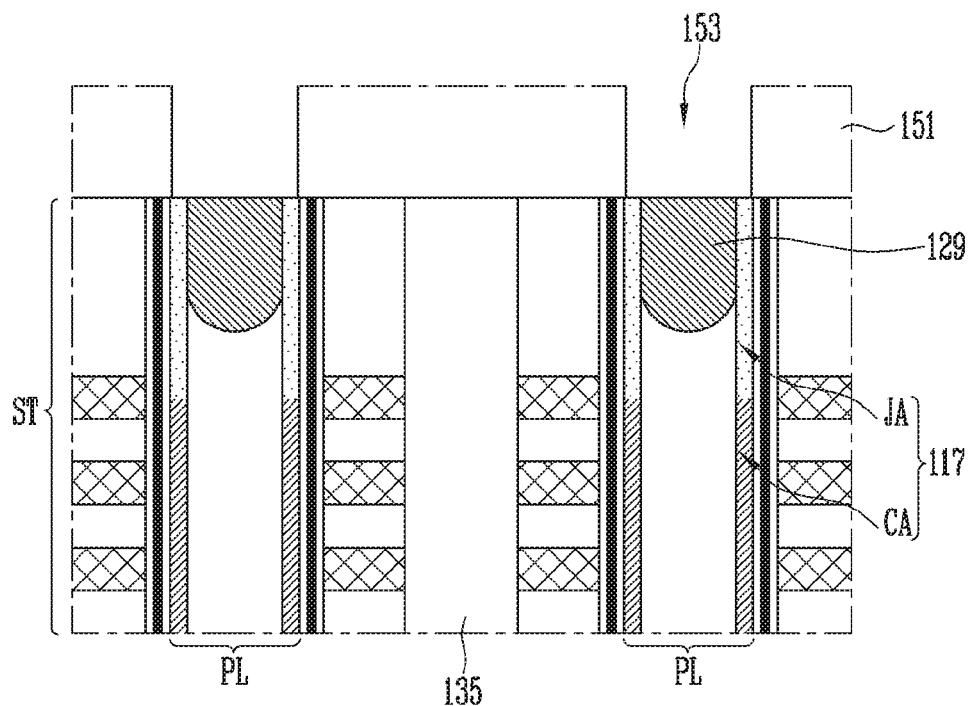
Figure 7B:
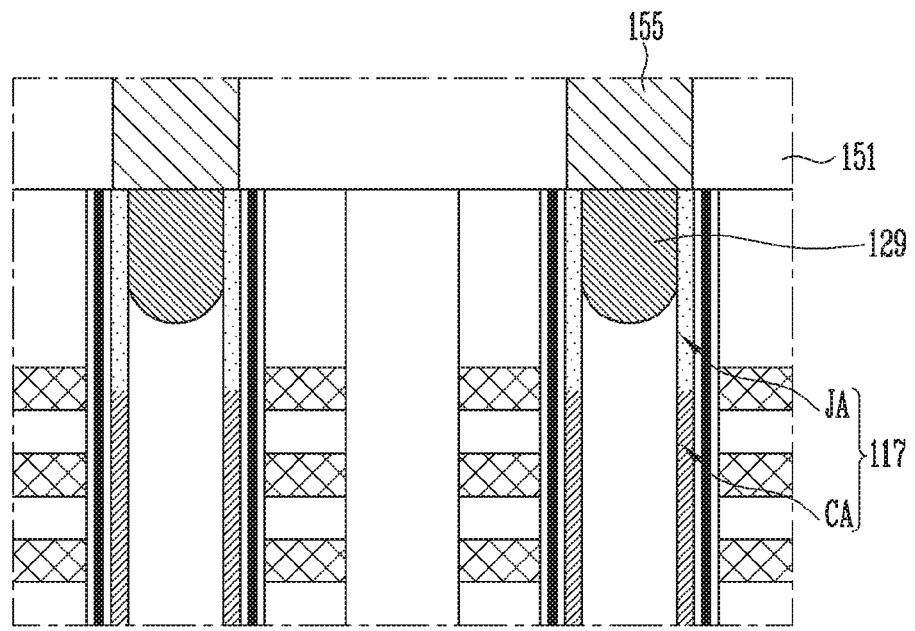

FIGS. 7A and 7B are cross-sectional diagrams illustrating step S13 illustrated in FIG. 3.

Referring to FIG. 7A, before performing step ST13, the slit 131 shown in FIG. 6B may be filled with a silt insulating layer 135.

Subsequently, an upper insulating layer 151 may be formed on the stack structures ST penetrated by the channel pillars PL and divided by the slit insulating layer 135. The upper insulating layer 151 may include an oxide layer.

Thereafter, an opening 153 exposing the etch stop layer 129 and the impurity region JA of the channel layer 117 may be formed by etching the upper insulating layer 151. The opening 153 may be a hole type exposing each of the channel pillars PL, An etching process of the upper insulating layer 151 for forming the opening 153 may be stopped when the etch stop layer 129 is exposed.

Referring to FIG. 7B, a contact plug 155 may be formed by filling the opening 153 illustrated in FIG. 7A with a conductive material. Thereafter, a process for forming the upper conductive line CL illustrated in FIGS. 2A and 2B may be performed.

Figure 8A:
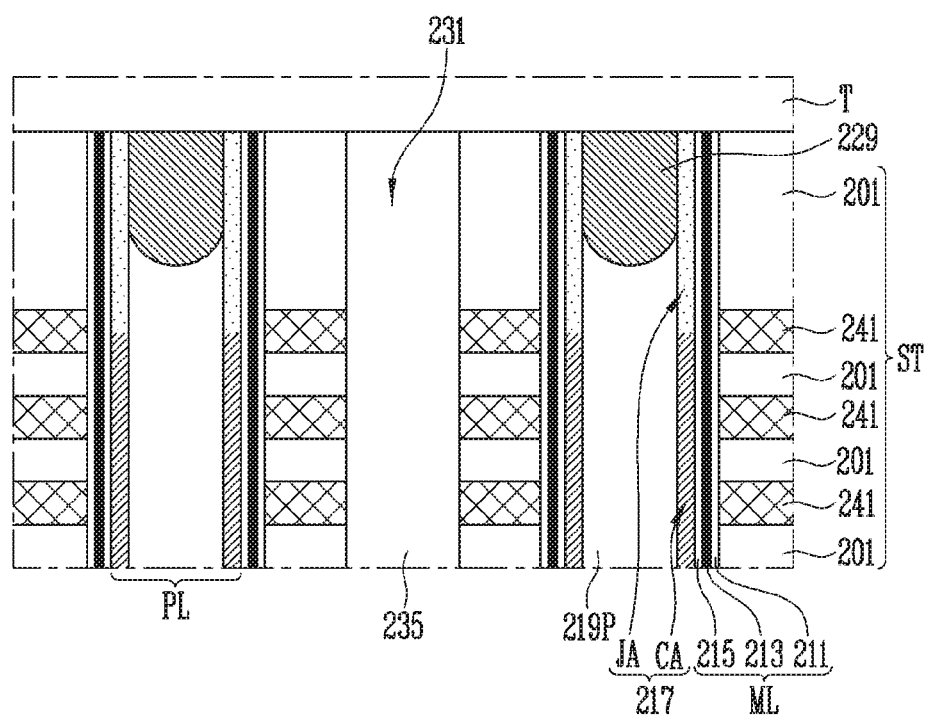
FIGS. 8A and 8B are cross-sectional diagrams illustrating a manufacturing method of a semiconductor device according to an embodiment.
Figure 8B:
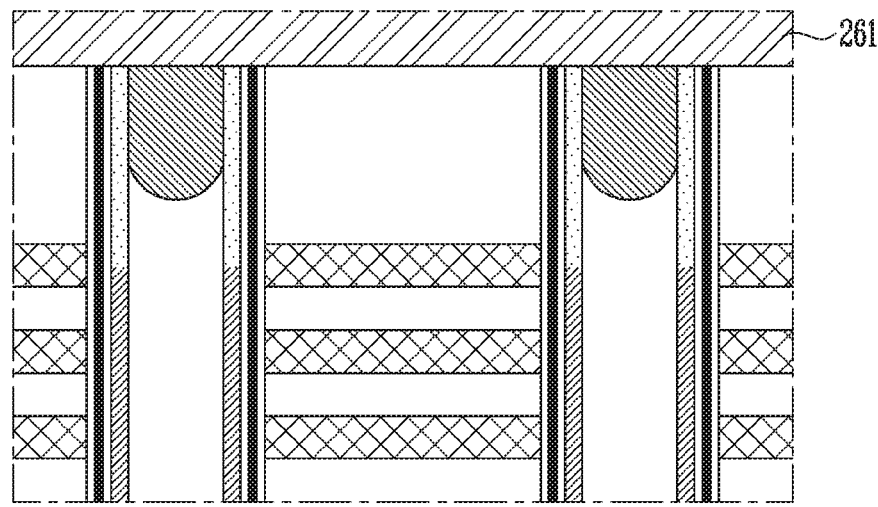

FIGS. 8A and 8B are cross-sectional diagrams illustrating a manufacturing method of a semiconductor device according to an embodiment. For example, FIGS. 8A and 8B are cross-sectional diagrams illustrating other embodiments of step S13 illustrated in FIG. 3.

Referring to FIG. 8A, the stack structures ST divided by a slit 231 and a slit insulating layer 235 may be formed. The stack structures ST may be formed using the processes described above with reference to FIGS. 4A, 4B, 5A, 5B, 6A, and 6B.

Each of the stack structures ST may include interlayer insulating layers 201 and conductive patterns 241 alternately stacked with each other, and may be penetrated by the channel pillar PL surrounded with the multilayer ML. The multilayer ML may include a blocking insulating layer 211, a data storage layer 213, and a tunnel insulating layer 215. The channel pillar PL may include a channel layer 217 including the channel region CA and the impurity region JA, a core insulating pattern 219P, and an etch stop layer 229. The core insulating pattern 219P and the etch stop layer 229 may fill a central region of the channel pillar PL.

The stack structures ST and the slit insulating layer 235 may be covered with an upper insulating layer and the upper insulating layer may be etched to form an opening T. The opening T may be a trench-type extending in one direction. The plurality of channel pillars PL arranged in a row in one direction may be exposed by the trench-type opening T.

Referring to FIG. 8B, an upper conductive line 261 may be formed by filling the opening T illustrated in FIG. 8A with a conductive material.

Figure 9A:
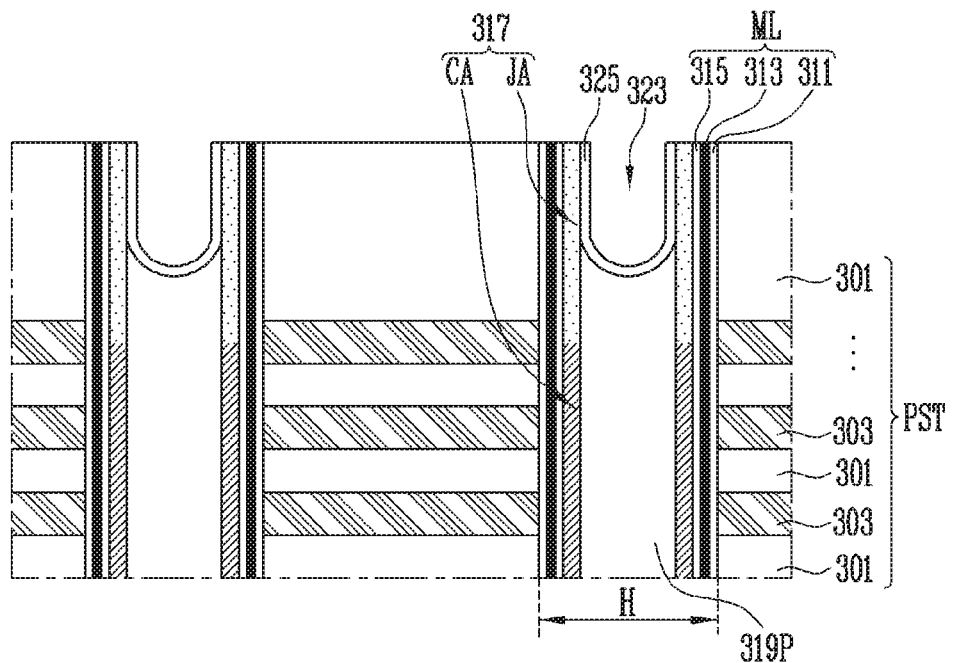
FIGS. 9A and 9B are cross-sectional diagrams illustrating a manufacturing method of a semiconductor device according to an embodiment.
Figure 9B:
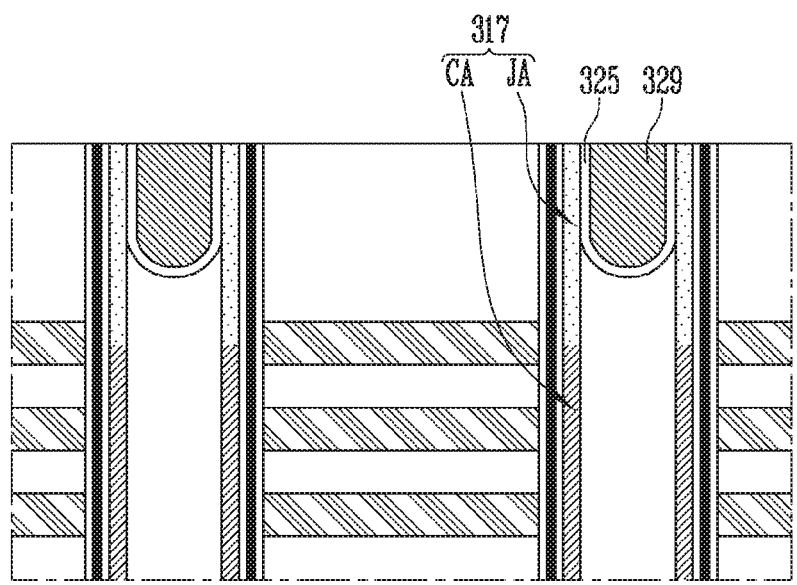

FIGS. 9A and 9B are cross-sectional diagrams illustrating a manufacturing method of a semiconductor device according to an embodiment. For example, FIGS. 9A and 93 are cross-sectional diagrams illustrating a process for forming a diffusion prevention layer which may be added between steps S9 and S11 shown in FIG. 3.

Referring to FIG. 9A, the stack structure PST including first material layers 301 and second material layers 303 alternately stacked with each other and penetrated by the hole H may be formed using the processes described with reference to FIG. 4A. Subsequently, the multilayer ML, a channel layer 317, and a core insulating layer which fill the hole H may be formed using the processes described with reference to FIG. 4A. The multilayer ML may include a blocking insulating layer 311, a data storage layer 313, and a tunnel insulating layer 315.

Thereafter, the processes described with reference to FIG. 4B may be performed to divide the channel layer 317 into the impurity region JA and the channel region CA. Thereafter, a core insulating pattern 319P and a recessed region 323 may be formed using the processes described with reference to FIG. 5A.

Subsequently, a diffusion prevention layer 325 extending along a surface of the recessed region 323 and a surface of the channel layer 317 may be formed. The diffusion prevention layer 325 may be formed using an oxide layer deposition process.

Referring to FIG. 9B, an etch stop layer 329 may be formed on the diffusion prevention layer 325 by using the processes described above with reference to FIG. 5B.

Thereafter, the subsequent process described above with reference to FIGS. 6A and 6B may be performed. Thereafter, the subsequent processes described above with reference to FIGS. 7A and 7B may be performed, or the subsequent processes described above with reference to FIGS. 8A and 8B may be performed. When the etch stop layer 329 includes an undoped semiconductor layer, a phenomenon in which an impurity in the impurity region JA diffuses into an undoped semiconductor layer may be prevented by the diffusion prevention layer 325. Accordingly, even when a manufacturing process of a semiconductor device is completed, the etch stop layer 329 may include an undoped semiconductor layer.

FIGS. 10A to 10D are perspective views illustrating semiconductor devices according to embodiments. For convenience of recognition, interlayer insulating layers are not illustrated in FIGS. 10A to 10D.

Figure 10A:
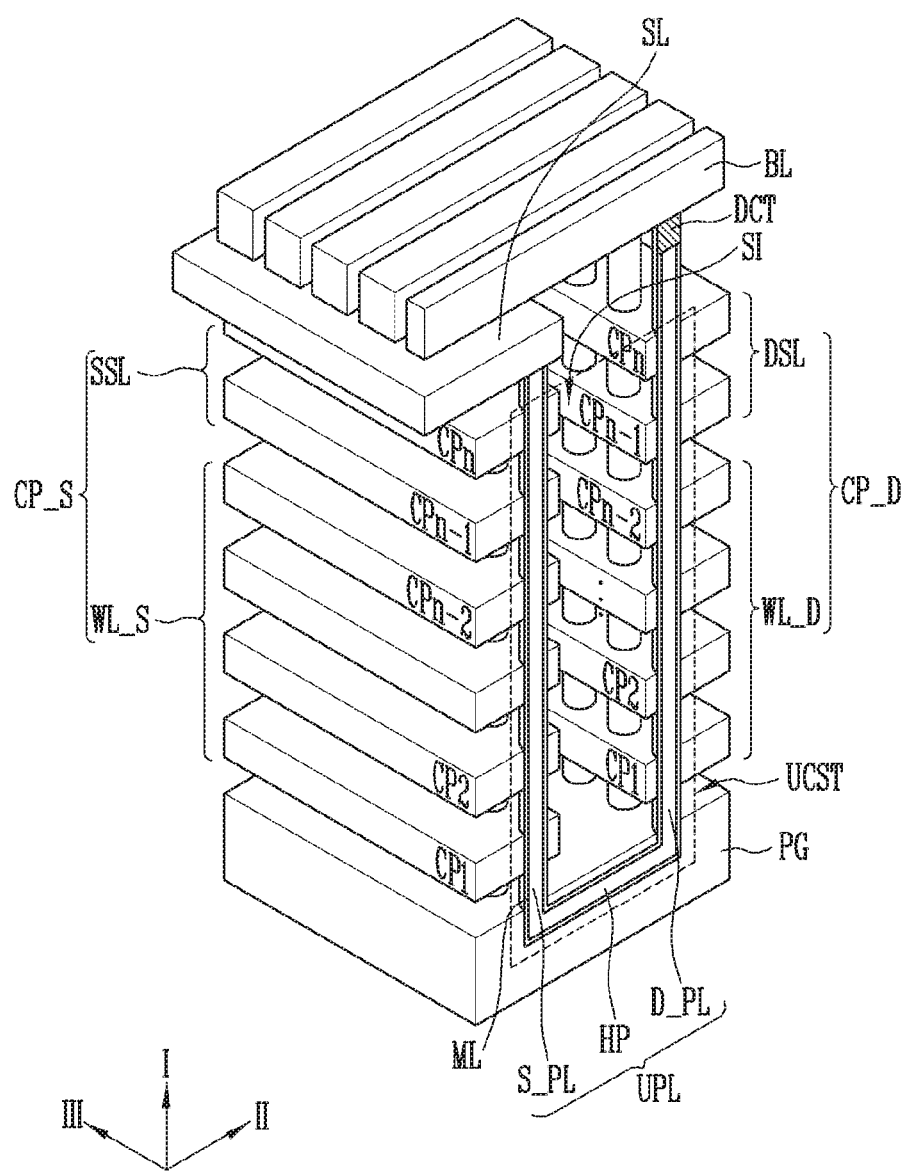
FIGS. 10A to 10D are perspective views illustrating semiconductor devices according to embodiments.
Figure 10B:
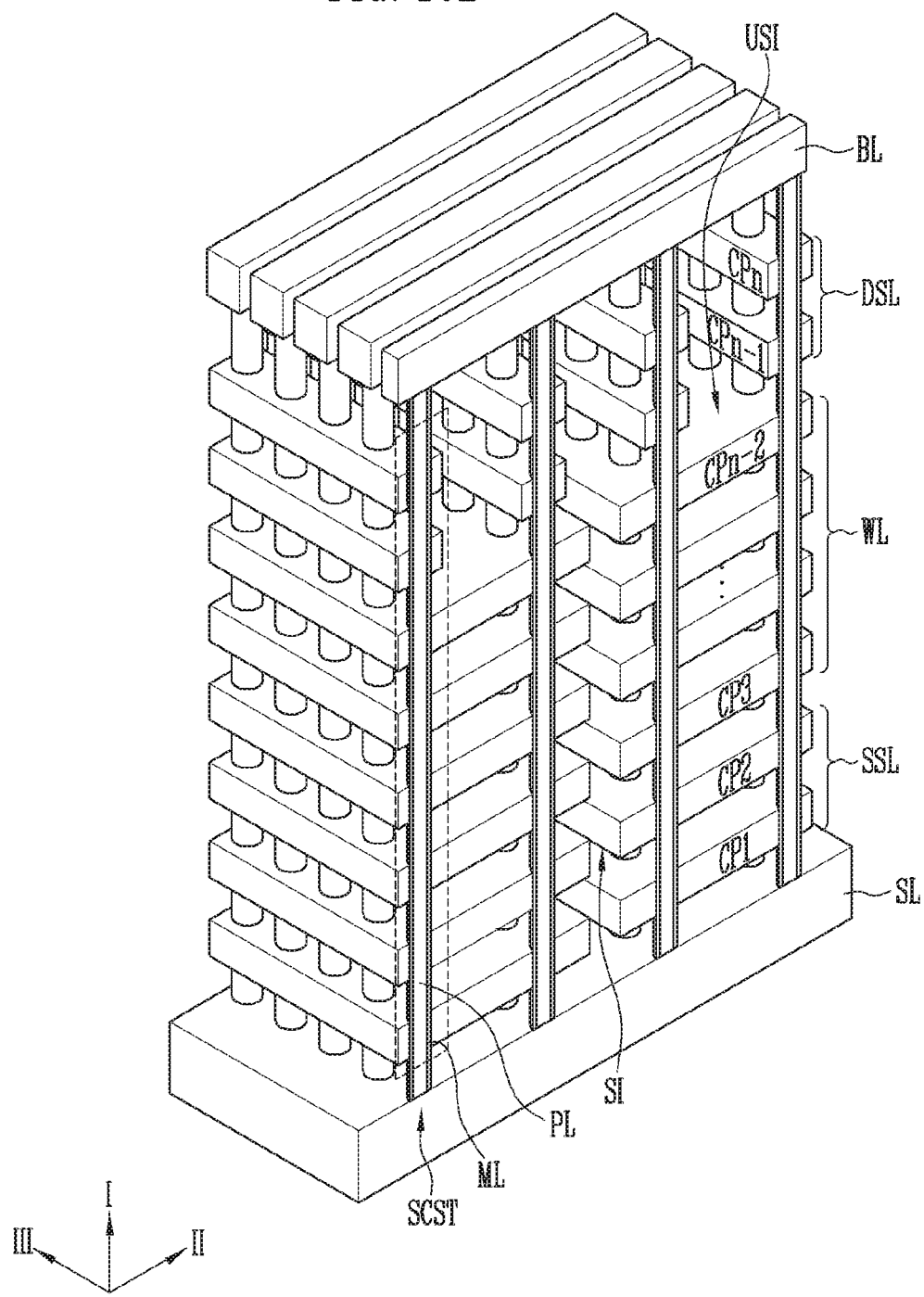
Figure 10C:
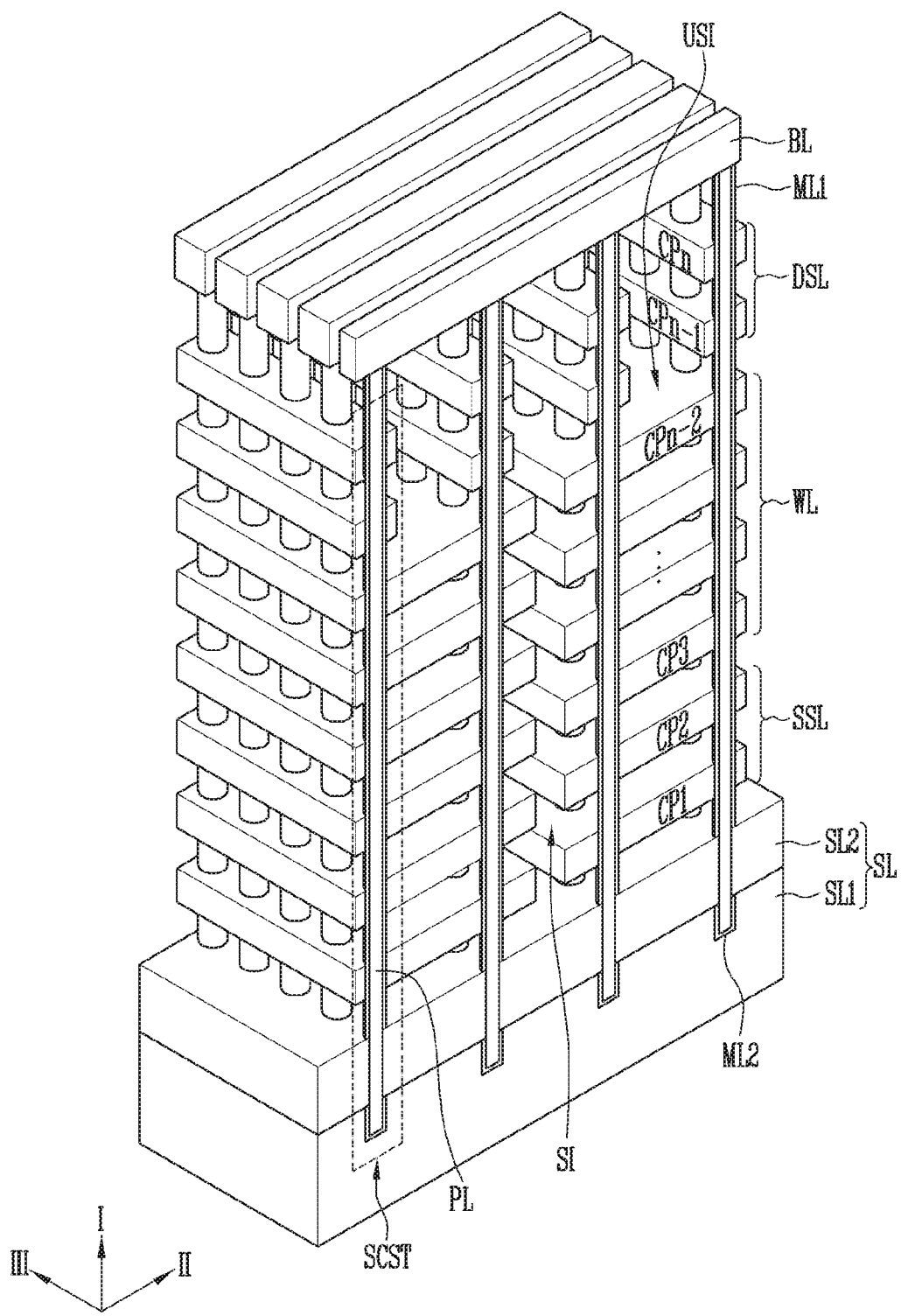
Figure 10D:
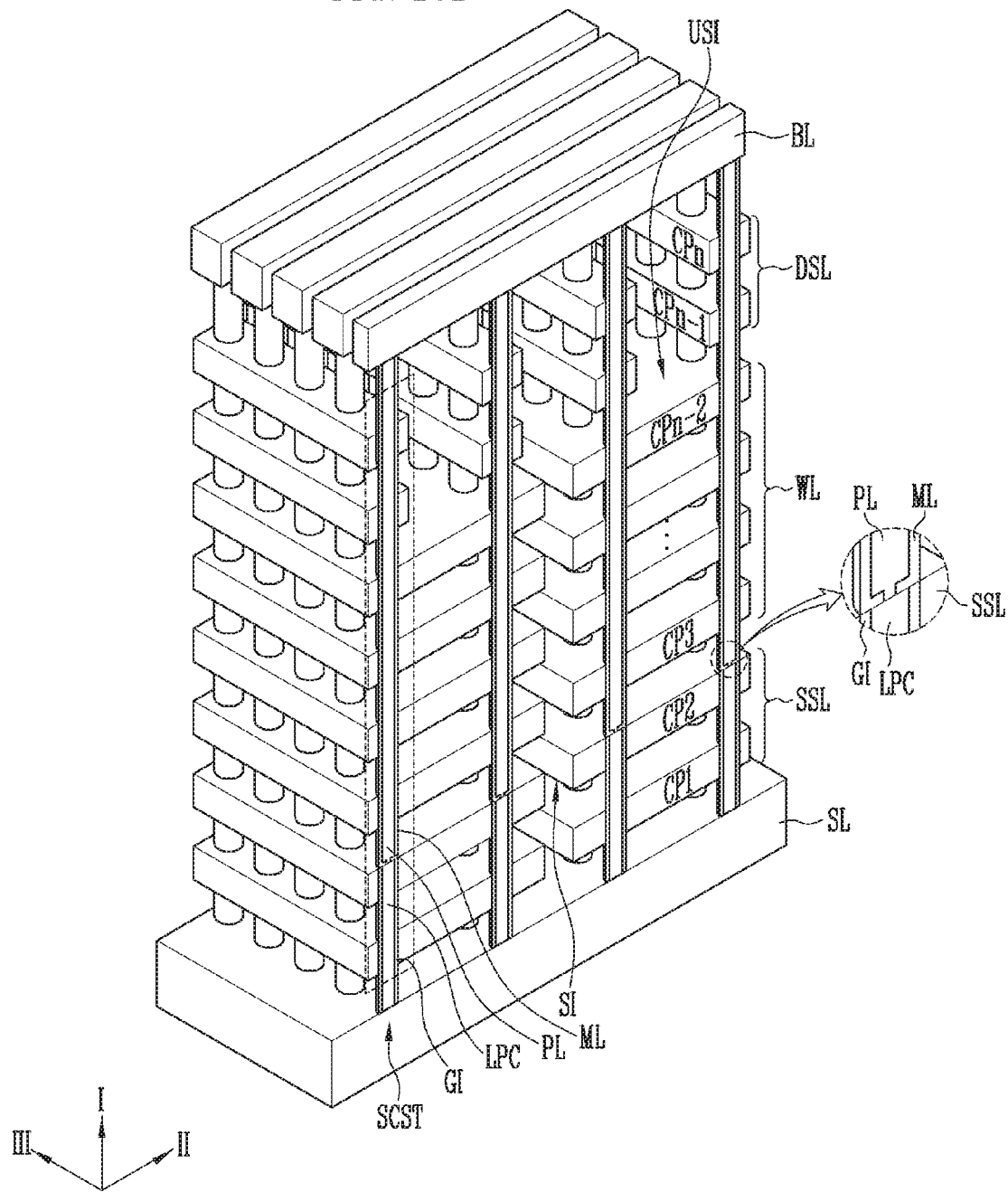

Referring to FIGS. 10A to 10D, a semiconductor device according to an embodiment may include memory strings having a three-dimensional structure UCST and SCST. The memory strings having a three-dimensional structure UCST and SCST may improve integration density of a semiconductor device. The memory strings having a three-dimensional structure UCST and SCST may be a U-type as illustrated in FIG. 10A or may be a straight type as illustrated in FIGS. 10B to 10D.

Referring to FIG. 10A, the U-type memory string UCST may include memory cells and select transistors arranged along a U-type channel pillar UPL. The memory cells and the select transistors may be coupled to source side conductive patterns CP_S and drain side conductive patterns CP_D. The source side conductive patterns CP_S may be spaced apart from the drain side conductive patterns CP_D by a slit SI.

The channel pillar UPL may be divided into a horizontal portion HP, a source side pillar S_PL, and a drain side pillar D_PL. The horizontal portion HP, the source side pillar S_PL, and the drain side pillar D_PL may be coupled to each other. The horizontal portion HP may be embedded in a pipe gate PG. The source side pillar S_PL and the drain side pillar D_PL may extend from the horizontal portion HP in the first direction I.

Each of the source side pillar S_PL and the drain side pillar D_PL may have the same structure as one of the channel pillars illustrated in FIGS. 2A to 2D. In other words, each of the source side pillar S_PL and the drain side pillar D_PL may include the channel layer CH, the core insulating layer CO, and the etch stop layer ES illustrated in FIGS. 2A to 2D. In addition, each of the source side pillar S_PL and the drain side pillar D_PL may further include the diffusion prevention layer BA illustrated in FIGS. 2B and 2D. Furthermore, the channel layer CH of each of the source side pillar S_PL and the drain side pillar D_PL may be divided into the impurity region JA and the channel region CA as illustrated in FIGS. 2A to 2D. The horizontal portion HP may include a channel layer and a core insulating layer which extend from the source side pillar S_PL or the drain side pillar D_PL.

The multilayer ML may be further formed on an outer wall of the channel pillar UPL.

The channel pillar UPL may be electrically coupled between a source layer SL and a bit line BL. The bit line BL and the source layer SL may be disposed in different levels and spaced apart from each other. For example, the source layer SL may be disposed under the bit line BL. The source layer SL may be electrically coupled to the source side pillar S_PL. The bit line BL may be electrically coupled to the drain side pillar D_PL. Each of the source layer SL and the bit line BL may correspond to one of the upper conductive lines illustrated in FIGS. 2A to 2D. A drain contact plug DCT may be further formed between the bit line BL and the drain side pillar D_PL. The drain contact plug DCT may correspond to the contact plug illustrated in FIGS. 2A and 2B. The source layer SL and the source side pillar S_PL may directly contact each other the same as the upper conductive line and the channel pillar illustrated in FIGS. 2C and 2D. However, the embodiments may not be limited thereto. According to an embodiment, a source contact plug (not illustrated) may be further disposed between the source layer SL and the source side pillar S_PL the same as the contact plug disposed between the upper conductive line and the channel pillar illustrated in FIGS. 2A and 2B.

The source side conductive patterns CP_S may include n conductive patterns CP1 to CPn stacked to be spaced apart from each other in the first direction I under the source layer SL, where n is a natural number of 2 or more. The drain side conductive patterns CP_D may include the n conductive patterns CP1 to CPn stacked to be spaced apart from each other in the first direction I under the bit line BL.

The source side conductive patterns CP_S may enclose the source side pillar S_PL and may be stacked to be spaced apart from each other. The source side conductive patterns CP_S may include source side word lines WL_S and a source select line SSL. The source select line SSL may be disposed above the source side word lines WL_S. One layer of the source select line SSL or two or more layers of the source select lines SSL may be disposed between the source side word lines WL_S and the source layer SL. Although FIG. 10A illustrates the configuration in which the source select line SSL consists of the nth pattern CPn disposed on the uppermost layer of the source side conductive patterns CP_S and the (n-1)th pattern CPn-1 under the nth pattern CPn as an example, the embodiments may not be limited thereto. The source side word lines WL_S may correspond to the word line WL illustrated in FIGS. 2A to 2D, and the source select lines SSL may correspond to the select lines SEL illustrated in FIGS. 2A to 2D.

The drain side conductive patterns CP_D may enclose the drain side pillar D_PL and may be stacked to be spaced apart from each other. The drain side conductive patterns CP_D may include drain side word lines WL_D and a drain select line DSL. The drain select line DSL may be disposed above the drain side word lines WL_D. One layer of the drain select line DSL or two or more layers of the drain select lines DSL may be disposed between the drain side word lines WL_D and the bit line BL. Although FIG. 10A illustrates the configuration in which the drain select line DSL consists of the nth pattern CPn disposed on the uppermost layer of the drain side conductive patterns CP_D and the (n-1)th pattern CPn-1 under the nth pattern CPn as an example, the embodiments may not be limited thereto. The drain side word lines WL_D may correspond to the word line WL illustrated in FIGS. 2A to 2D, and the drain select lines DSL may correspond to the select lines SEL illustrated in FIGS. 2A to 2D.

The slit SI may be disposed between the source side conductive patterns CP_S and the drain side conductive patterns CP_D which neighbor each other in the second direction II and may extend in the third direction III. Each of the source side conductive patterns CP_S, the drain side conductive patterns CP_D, and the source layer SL may extend in the third direction III. The bit line BL may extend in the second direction II.

The pipe gate PG may be disposed under the source side conductive patterns CP_S and the drain side conductive patterns CP_D and may enclose the horizontal portion HP. The pipe gate PG may be disposed under the conductive patterns CP1 to CPn.

Source side memory cells may be formed at intersections of the source side pillar S_PL and the source side word lines WL_S, and drain side memory cells may be formed at intersections of the drain side pillar D_PL and the drain side word lines WL_D. A source select transistor may be formed at an intersection of the source side pillar S_PL and the source select line SSL, and a drain select transistor may be formed at an intersection of the drain side pillar D_PL and the drain select line DSL. A pipe transistor may be formed at an intersection of the horizontal portion HP and the pipe gate PG. The source select transistor, the source side memory cells, the pipe transistor, the drain side memory cells, and the drain select transistor which are arranged along the U-type channel pillar UPL may be coupled in series through a channel layer included in the U-type channel pillar UPL. The source select transistor, the source side memory cells, the pipe transistor, the drain side memory cells, and the drain select transistor which are coupled in series may define the U-type memory string UCST along the shape of the U-type channel pillar UPL. The source side word lines WL_S may transmit a signal to gates of the source side memory cells, the drain side word lines WL_D may transmit a signal to gates of the drain side memory cells, the source select line SSL may transmit a signal to a gate of the source select transistor, the drain select line DSL may transmit a signal to a gate of the drain select transistor, and the pipe gate PG may transmit a signal to a gate of the pipe transistor. The pipe transistor may couple the source side memory cells and the drain side memory cells in response to a signal applied to the pipe gate PG.

In addition to the U type as described above, channel pillars may have various shapes such as a W type. Arrangement of memory cells may be variously changed according to a structure of a channel pillar, therefore memory strings may have various structures.

Referring to FIGS. 10B to 10D, the straight type memory string SCST may include memory cells and select transistors stacked along the straight type channel pillar PL.

Gates of the memory cells and gates of the select transistors may be coupled to the conductive patterns CP1 to CPn. The conductive patterns CP1 to CPn may be divided into the word lines WL, the source select lines SSL, and the drain select lines DSL by the slit SI and a slit USI.

The channel pillar PL may have the same structure as one of the channel pillars illustrated in FIGS. 2A to 2D. In other words, the channel pillar PL may include the channel layer CH, the core insulating layer CO, and the etch stop layer ES shown in FIGS. 2A to 2D. In addition, the channel pillar PL may further include the diffusion prevention layer BA illustrated in FIGS. 2B and 2D, The channel layer CH of the channel pillar PL may be divided into the impurity region JA and the channel region CA illustrated in FIGS. 2A to 2D. An outer wall of the channel pillar PL may be surrounded with the multilayer ML or multilayers ML1 and ML2.

The channel pillars PL may be electrically coupled to the bit line BL. The bit line BL may correspond to one of the upper conductive lines illustrated in FIGS. 2A to 2D. The bit line BL and the channel pillars PL may directly contact each other the same as the upper conductive line and the channel pillar illustrated in FIGS. 2C and 2D. The embodiments may not be limited thereto, and a drain contact plug may be further disposed between the bit line BL and each of the channel pillars PL the same as the contact plug disposed between the upper conductive line and the channel pillar illustrated in FIGS. 2A and 2B.

The channel pillars PL may be coupled to the source layer SL as illustrated in FIGS. 10B and 10C. The source layer SL may have various structures.

Referring to FIG. 10B, the source layer SL may contact a bottom surface of each of the channel pillars PL. The source layer SL may be a doped polysilicon layer. Each of the channel pillars PL may contact an upper surface of the source layer SL and may extend in the first direction I towards the bit line BL.

The multilayer ML may extend along a sidewall of the channel pillar PL. An upper surface and the bottom surface of the channel pillar PL may not be blocked by the multilayer ML but may be opened. The bottom surface of the channel pillar PL may be electrically coupled to the source layer SL.

Referring to FIG. 10C, each of the channel pillars PL may extend into the source layer SL. For example, the source layer SL may have a stacked structure of a first source layer SL1 and a second source layer SL2. The first source layer SL1 may enclose a lower end of each of the channel pillars PL. The second source layer SL2 may be disposed above the first source layer SL1 and may contact an upper surface of the first source layer SL1 and a sidewall of each of the channel pillars PL. The second source layer SL2 may enclose each of the channel pillars PL.

The upper end of each of the channel pillars PL protruding in the first direction I farther than the second source layer SL2 may be surrounded with the first multilayer pattern MLA. The second multilayer pattern ML2 may be disposed between the first source layer SL1 and each of the channel pillars PL. The first multilayer pattern ML1 and the second multilayer pattern ML2 may include the same material layers with each other. Each of the first multilayer patterns ML1 and each of the second multilayer patterns ML2 may be divided from each other by the second source layer SL2.

Each of the channel pillars PL may be coupled to a lower channel pillar LPC as illustrated in FIG. 10D.

Referring to FIG. 10D, the lower channel pillar LPC may be coupled under each of the channel pillars PL. The lower channel pillars LPC may be surrounded with the source select lines SSL and the channel pillars PL may be surrounded with the word lines WL and the drain select lines DSL.

An outer wall of each of the lower channel pillars LPC may be surrounded with a gate insulating layer GI. The source layer SL may contact a bottom surface of each of the lower channel pillars LPC. The source layer SL may be a doped polysilicon layer. The channel layer CH described with reference to FIGS. 2A to 2D may extend to a bottom surface of each of the channel pillars PL illustrated in FIG. 10D, and may contact an upper surface of each of the lower channel pillars LPC.

The multilayer ML may extend along a sidewall of each of the channel pillars PL. The upper surface and the bottom surface of each of the channel pillars PL may not be blocked by the multilayer ML, but may be opened.

Referring to FIGS. 10B to 10D, the conductive patterns CP1 to CPn may be disposed on n levels spaced apart from each other between the bit line BL and the source layer SL, respectively. The conductive patterns CP1 to CPn may enclose the channel pillars PL or the lower channel pillars LPC, and may be stacked to be spaced apart from each other in the first direction I. The conductive patterns CP1 to CPn may include the source select line SSL, the word lines WL and the drain select line DSL. The source select line SSL may be disposed above the source layer SL. The word lines WL may be disposed above the source select line SSL. The drain select line DSL may be disposed above the word lines WL.

The slits SI and USI may include the first slit SI completely passing through the conductive patterns CP1 to CPn and the second slit USI passing through one or more layers from the uppermost conductive pattern among the conductive patterns CP1 to CPn. The first slit SI and the second slit USL may extend in the third direction III.

Some of the conductive patterns CP1 to CPn successively stacked, for example, the conductive patterns CP3 to CPn-2 may be divided into the word lines WL by the first slit SI.

One layer of conductive pattern or two or more layers of conductive patterns disposed between the word lines WL and the source layer SL may be divided into the source select lines SSL by the first slit SI. Although FIGS. 10B to 10D illustrate the configuration in which the source select line SSL includes the first conductive pattern CP1 disposed on the lowermost level and the second conductive pattern CP2 above the first conductive pattern CP1 among the conductive patterns CP1 to CPn as an example, the embodiments may not be limited thereto.

One layer of conductive pattern or two or more layers of conductive patterns disposed between the word lines WL and the bit line BL may be divided into the drain select lines DSL by the first slit SI and the second slit USI. Although FIGS. 10B to 10D illustrate the configuration in which the drain select line DSL includes the nth pattern CPn disposed on the uppermost level and the (n-1)th pattern CPn-1 under the nth pattern CPn among the conductive patterns CP1 to CPn as an example, the embodiments may not be limited thereto. The word lines WL may correspond to the word line WL illustrated in FIGS. 2A to 2D, and the drain select lines DSL may correspond to the select lines SEL illustrated in FIGS. 2A to 2D.

The word lines WL, the drain select lines DSL, and the source select lines SSL may extend in the third direction III. The bit line BL may extend in the second direction II.

The first slit SI and the second slit USI may be alternately disposed with each other in the second direction II. Each of the word lines WL may not be divided by the second slit USI and may extend to overlap the second slit USI. Each of the word lines WL may enclose the plurality of channel pillars PL in common. The channel pillars PL surrounded in common with each of the word lines WL may be divided into bit groups surrounded with the drain select lines DSL, respectively. For example, the channel pillars PL which each of the word lines WL encloses in common may be divided into a first bit group and a second bit group with the second slit USI interposed therebetween. The first bit group and the second bit group may be controlled by different drain select lines DSL, respectively.

According to the structure described above with reference to FIGS. 10B to 10D, the memory cells may be formed at the intersections of the channel pillar PL and the word lines WL, the drain select transistor may be formed at the intersection of the channel pillar PL and the drain select line DSL, and the source select transistor may be formed at the intersection of the channel pillar PL and the source select line SSL or the intersection of the lower channel pillar LPC and the source select line SSL. The source select transistor, the memory cells, and the drain select transistor arranged in a row along at least one of the channel pillar PL and the lower channel pillar LPC may be coupled in series by at least one of the channel layer of the channel pillar PL and the lower channel pillar LPC to define the straight type memory string SCST. The word lines WL may transmit a signal to gates of the memory cells, the source select line SSL may transmit a signal to a gate of the source select transistor, and the drain select line DSL may transmit a signal to a gate of the drain select transistor.

The three-dimensional semiconductor device illustrated in FIGS. 10A to 10D may be formed using the processes shown in FIGS. 4A, 4B, 5A, 5B, 6A, 6B, 7A, and 7B, the processes illustrated in FIGS. 8A and 8B, or the processes illustrated in FIGS. 9A and 9B.

Figure 11:
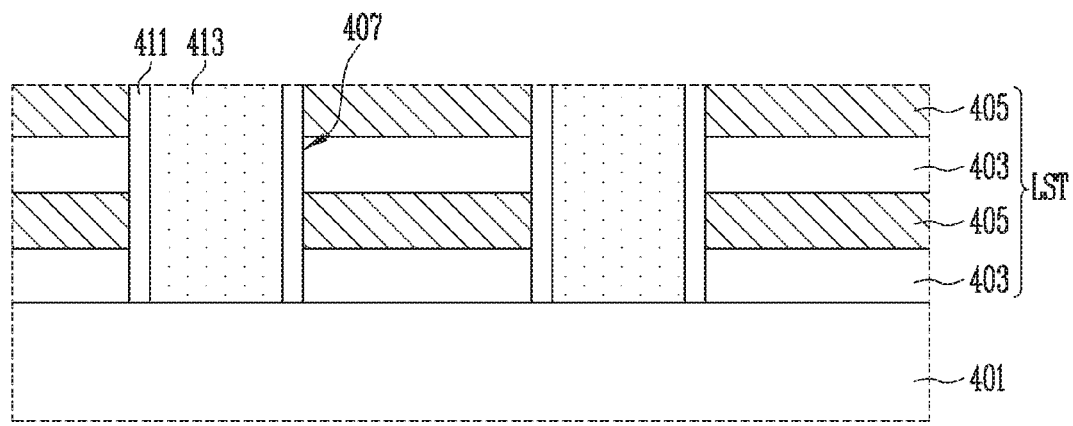
FIG. 11 is a cross-sectional diagram schematically illustrating an embodiment of a forming process of a lower channel pillar shown in FIG. 10D.

FIG. 11 is a cross-sectional diagram schematically illustrating an embodiment of a forming process of the lower channel pillar illustrated in FIG. 10D.

Referring to FIG. 11, a lower channel pillar 413 may pass through a lower stack structure LST formed on a source layer 401.

The source layer 401 may be formed by injecting an impurity into a surface of a substrate, depositing a doped semiconductor layer on the substrate, or depositing a doped semiconductor layer on an insulating layer. The impurity may be an n-type impurity and the doped semiconductor layer may include an n-type impurity.

The lower stack structure LST may include third material layers 403 and fourth material layers 405 alternately stacked with each other. The lower stack structure LST may be formed by stacking at least one sub-stack structure including the third material layer 403 and the fourth material layer 405.

The third material layer 403 and the fourth material layer 405 may include various materials.

According to first embodiments, the third material layer 403 may include a material which may not only insulate conductive patterns from each other, but have a great etch resistance with respect to an etching material used during a subsequent etching process for selectively removing the fourth material layer 405. For example, the third material layer 403 may include an oxide layer such as a silicon oxide layer and the fourth material layer 405 may include a nitride layer such as a silicon nitride layer. The third material layers 403 may remain as interlayer insulating layers after a manufacturing process of a semiconductor device is completed and the fourth material layer 405 may be replaced with a conductive pattern for a source select line during a subsequent process.

According to second embodiments, the third material layer 403 may include a material which may insulate conductive patterns from each other, and the fourth material layer 405 may include various conductive materials for a source select line. For example, the third material layer 403 may include an oxide layer such as a silicon oxide layer and the fourth material layer 405 may include at least one of a silicon layer, a metal layer, and a metal silicide layer. In addition, the fourth material layer 405 may further include a barrier metal layer. The third material layers 403 may remain as interlayer insulating layers after a manufacturing process of a semiconductor device is completed, and the fourth material layer 405 may remain as a source select line after a manufacturing process of a semiconductor device is completed.

According to third embodiments, the fourth material layer 405 may include a conductive material for a source select line, and the third material layer 403 may include a material which may selectively remove the fourth material layer 405 and minimize a loss of the fourth material layer 405. For example, the third material layer 403 may include an undoped silicon layer and the fourth material layer 405 may include a doped silicon layer. The third material layers 403 may be replaced with interlayer insulating layers during a subsequent process and the fourth material layer 405 may remain as a source select line after a manufacturing process of a semiconductor device is completed.

After forming the lower stack structure LST, lower holes 407 passing through the lower stack structure LST may be formed. The lower holes 407 may expose the source layer 401. Subsequently, a gate insulating layer 411 may be formed on a sidewall of each of the lower holes 407. The gate insulating layer 411 may include an oxide layer such as a silicon oxide layer.

Thereafter, the lower channel pillars 413 may be formed in the lower holes 407, respectively. Each of the lower channel pillars 413 may be formed by growing a semiconductor material by a selective epitaxial growth method. Alternatively, each of the lower channel pillars 413 may be formed by depositing a semiconductor material. An impurity may be doped into each of the lower channel pillars 413 by an in-situ method or an ion injection method.

As described above, after forming the lower channel pillar 413 passing through the lower stack structure LST, the processes illustrated in FIGS. 4A, 4B, 5A, 5B, 6A, 6B, 7A, and 7B may be performed. The processes described with reference to FIGS. 7A and 7B may be replaced with the processes described with reference to FIGS. 8A and 8B. The processes described with reference to FIGS. 5A and 5B may be replaced with the processes described with reference to FIGS. 9A and 9B.

The third material layer 403 of the lower stack structure LST may include the same material as the first material layer described with reference to FIG. 4A and the fourth material layer 405 of the lower stack structure LST may include the same material as the second material layer described with reference to FIG. 4A. When each of the second material layer and the fourth material layer 405 include a sacrificial layer such as a silicon nitride layer, the fourth material layer 405 may be replaced with a conductive pattern for a source select line by using a process for replacing the second material layer with the conductive pattern. When each of the first material layer and the third material layer 403 may include a sacrificial layer such as an undoped silicon layer, the third material layer 403 may be replaced with an interlayer insulating layer by using a process for replacing the first material layer with an interlayer insulating layer.

Figure 12A:
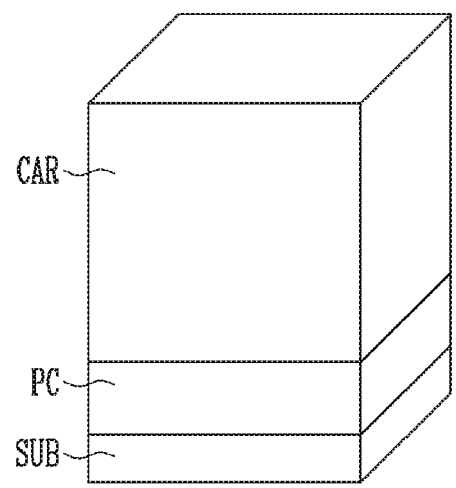
FIGS. 12A and 12B are a block diagram and a cross-sectional diagram, respectively, schematically illustrating a peripheral circuit structure according to an embodiment.
Figure 12B:
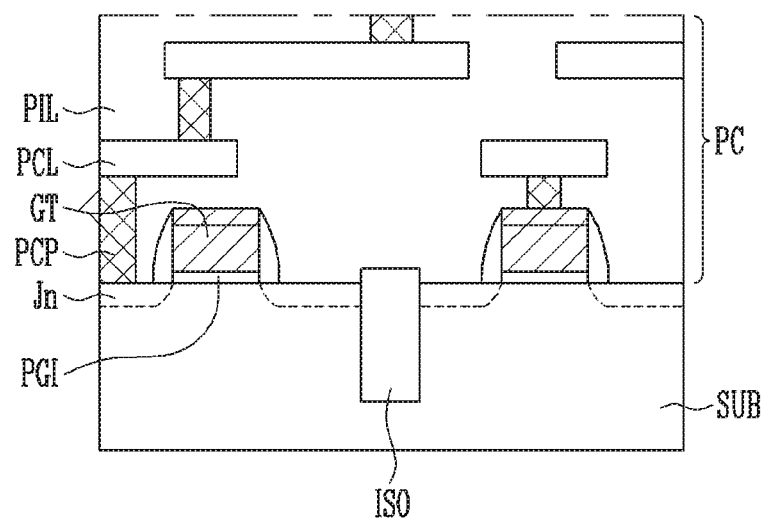

FIGS. 12A and 12B are a block diagram and a cross-sectional diagram, respectively, schematically illustrating a peripheral circuit structure PC according to an embodiment.

Referring to FIG. 12A, a semiconductor device according to embodiments may include the peripheral circuit structure PC and a cell array CAR disposed on a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The cell array CAR may include at least one of the memory strings described with reference to FIGS. 10A to 10D. A channel pillar of a memory string according to an embodiment may include one of the channel pillars described with reference to FIGS. 2A to 2D.

The peripheral circuit structure PC may include NMOS and PMOS transistors, a resistor, and a capacitor which are electrically coupled to the cell array CAR. The NMOS and PMOS transistors, the resistor, and the capacitor may serve as devices which constitute a row decoder, a column decoder, a page buffer, and a control circuit.

The peripheral circuit structure PC may be disposed between the cell array CAR and the substrate SUB. Since the peripheral circuit structure PC overlaps the cell array CAR, an area which is occupied by the cell array CAR region and the peripheral circuit structure PC on the substrate SUB may be decreased.

Referring to FIG. 12B, the peripheral circuit structure PC may include peripheral gate electrodes GT, a peripheral gate insulating layer PGI, junctions Jn, peripheral circuit wires PCL, peripheral contact plugs PCP, and a peripheral insulating layer PIL.

The peripheral gate electrodes GT may serve as gate electrodes of the NMOS transistor and the PMOS transistor of the peripheral circuit structure PC, respectively. The peripheral gate insulating layer PGI may be disposed between each of the peripheral gate electrodes GT and the substrate SUB.

The junctions Jn may be regions defined by injecting an n-type or p-type impurity into an active region of the substrate SUB. The junctions Jn may be disposed at both sides of each of the peripheral gate electrodes GT and may serve as source junctions or drain junctions. The active region of the substrate SUB may be divided by an isolation layer ISO formed in the substrate SUB. The isolation layer ISO may include an insulating material.

The peripheral circuit wires PCL may be electrically coupled to a circuit of the peripheral circuit structure PC through the peripheral contact plugs PCP.

The peripheral circuit insulating layer PIL may cover the circuit of the peripheral circuit structure PC, the peripheral circuit wires PCL, and the peripheral contact plugs PCP. The peripheral circuit insulating layer PIL may include insulating layers stacked in multiple layers.

The present disclosure may improve the operational reliability of a semiconductor device by uniformly controlling a depth of an impurity region formed in a channel layer.

According to the present disclosure, a process of injecting an impurity into a channel layer may be performed before recessing a core insulating layer, therefore the change in injection depth of an impurity which is caused by inhomogeneity of degrees of recess of a core insulating layer may be prevented. Thereby, the present disclosure may improve the reproducibility of a process of a semiconductor device.

According to the present disclosure, a recessed region of a core insulating layer may be filled with an etch stop layer, diffusion of an impurity from an inside of a channel layer to the etch stop layer may be decreased, or diffusion of an impurity from the etch stop layer into the channel layer may be decreased. Thereby, the present disclosure may decrease a distribution range of an impurity region formed in the channel layer and the change in concentration of the impurity region, and thus improve the reproducibility of a process of a semiconductor device.

Figure 13:
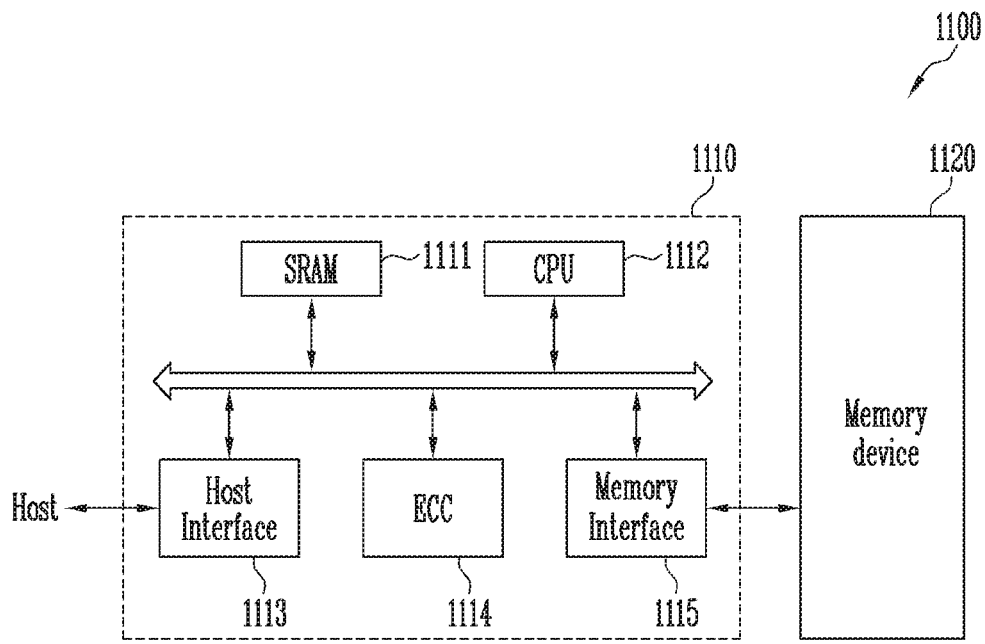
FIG. 13 is a block diagram illustrating a configuration of a memory system according to an embodiment.

FIG. 13 is a block diagram illustrating a configuration of a memory system 1100 according to an embodiment.

Referring to FIG. 13, the memory system 1100 according to the embodiments may include a memory device 1120 and a memory controller 1110.

The memory device 1120 may be a multi-chip package formed of a plurality of flash memory chips.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112, the CPU 1112 may perform overall control operations for data exchange of the memory controller 1110, and the host interface 1113 may include a data exchange protocol for a host connected with the memory system 1100. In addition, the ECC 1114 may detect and correct errors included in the data read from the memory device 1120, and the memory interface 1115 may perform interfacing with the memory device 1120. In addition, the memory controller 1110 may further include a Read Only Memory (ROM) for storing code data for interfacing with the host.

The above-described memory system 1100 may be a memory card or a Solid State Disk (SSD) equipped with the memory device 1120 and the memory controller 1110. For example, when the memory system 1100 is an SSD, the memory controller 1110 may communicate with an external device (e.g., a host) through one of the interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 14:
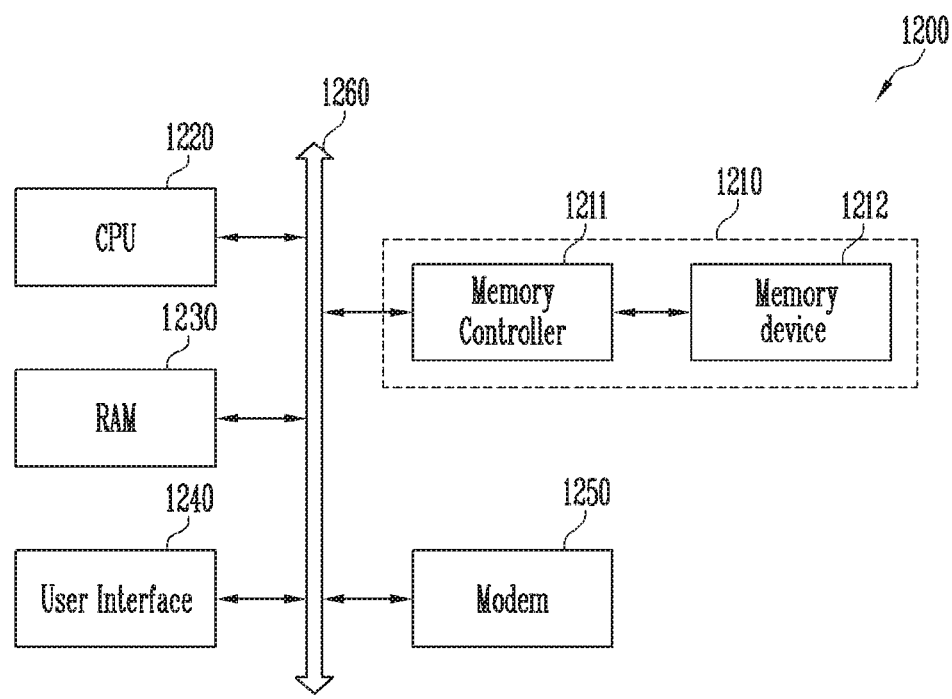
FIG. 14 is a block diagram illustrating a configuration of a computing system according to an embodiment.

FIG. 14 is a block diagram illustrating a configuration of a computing system 1200 according to an embodiment.

Referring to FIG. 14, the computing system 1200 according to the embodiments may include a CPU 1220, a Random Access Memory (RAM) 1230, a user interface 1240, a modem 1250, and a memory system 1210 which are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included.

The memory system 1210 may include a memory device 1212 and a memory controller 1211.

The above-discussed embodiments aim to help those with ordinary knowledge in this art more clearly understand the present disclosure rather than aiming to limit the bounds of the present disclosure. It should be understood that many variations and modifications of the concepts described herein will still fall within the spirit and scope of the present disclosure as defined in the accompanying claims and equivalents thereof.

So far as not being differently defined, all terms used herein including technical or scientific terminologies have meanings that they are commonly understood by those skilled in the art to which the present disclosure pertains. So far as not being clearly defined in this application, terms should not be understood in an ideally or excessively formal way.

What is claimed is:

1. A semiconductor device, comprising:
   a core insulating layer extending in a first direction;
   an etch stop layer disposed on an upper surface of the core insulating layer;
   a channel layer surrounding a sidewall of the core insulating layer and a sidewall of the etch stop layer and extending in the first direction;
   conductive patterns each surrounding the channel layer and stacked to be spaced apart from each other in the first direction;
   an impurity region formed in an upper end of the channel layer; and
   a diffusion prevention layer extending between the impurity region and the etch stop layer wherein the diffusion prevention layer forms an interface between the impurity region and the etch stop layer.

2. The semiconductor device of claim 1, wherein the etch stop layer includes a different material from the channel layer, wherein the material of the channel layer is an undoped semiconductor layer.

3. The semiconductor device of claim 1, wherein the etch stop layer includes a different material from the channel layer, wherein the material of the channel layer is a doped semiconductor layer including an impurity having a lower concentration than the impurity region.

4. The semiconductor device of claim 1, wherein the impurity region surrounds the etch stop layer.

5. The semiconductor device of claim 1, wherein the impurity region surrounds the etch stop layer and a portion of an upper end of the core insulating layer which is adjacent to the etch stop layer.

6. The semiconductor device of claim 1, wherein the etch stop layer includes at least one of a doped semiconductor layer including an impurity having a lower concentration than the impurity region, an undoped semiconductor layer, a metal layer, a metal-containing layer, and a nitride layer.

7. The semiconductor device of claim 1, wherein the etch stop layer includes at least one of a doped silicon layer including an impurity having a lower concentration than the impurity region, an undoped silicon layer, a tungsten layer, a titanium nitride layer, an aluminum oxide layer, and a silicon nitride layer.

8. The semiconductor device of claim 1, wherein the diffusion prevention layer extends along an interface between the etch stop layer and the core insulating layer.

9. The semiconductor device of claim 1, wherein the diffusion prevention layer includes an oxide layer.

10. The semiconductor device of claim 1, further comprising:
    a contact plug directly contacting the impurity region and the etch stop layer; and
    an upper conductive line directly contacting the contact plug.

11. The semiconductor device of claim 1, further comprising an upper conductive line directly contacting the impurity region and the etch stop layer.

12. The semiconductor device of claim 1, wherein the conductive patterns include word lines and at least one layer of a select line disposed above the word lines, and wherein the impurity region overlaps the at least one layer of the select line.

* * * * *